(12) United States Patent
Lea et al.

(10) Patent No.: US 11,664,064 B2
(45) Date of Patent: *May 30, 2023

(54) APPARATUSES AND METHODS FOR OPERATIONS IN A SELF-REFRESH STATE

(71) Applicant: Micron Technology, Inc., Boise, ID (US)

(72) Inventors: Perry V. Lea, Eagle, ID (US); Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/698,073

(22) Filed: Mar. 18, 2022

(65) Prior Publication Data
US 2022/0208257 A1 Jun. 30, 2022

Related U.S. Application Data

(60) Continuation of application No. 16/665,648, filed on Oct. 28, 2019, now Pat. No. 11,282,563, which is a
(Continued)

(51) Int. Cl.
*G11C 11/406* (2006.01)
*G11C 7/10* (2006.01)
(Continued)

(52) U.S. Cl.
CPC ........ *G11C 11/40615* (2013.01); *G06F 3/061* (2013.01); *G06F 3/0616* (2013.01);
(Continued)

(58) Field of Classification Search
CPC . G11C 11/40615; G11C 5/025; G11C 7/1006; G11C 7/1036; G11C 8/12;
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Zhuo H Li
(74) *Attorney, Agent, or Firm* — Brooks, Cameron & Huebsch, PLLC

(57) ABSTRACT

The present disclosure includes apparatuses and methods for performing operations by a memory device in a self-refresh state. An example includes an array of memory cells and a controller coupled to the array of memory cells. The controller is configured to direct performance of compute operations on data stored in the array when the array is in a self-refresh state.

20 Claims, 9 Drawing Sheets

Related U.S. Application Data division of application No. 15/222,514, filed on Jul. 28, 2016, now Pat. No. 10,468,087.

(51) Int. Cl.

| | |
|---|---|
| *G11C 8/12* | (2006.01) |
| *G11C 11/4096* | (2006.01) |
| *G11C 5/02* | (2006.01) |
| *G06F 3/06* | (2006.01) |
| *G11C 11/408* | (2006.01) |
| *G11C 11/4091* | (2006.01) |
| *G11C 11/4093* | (2006.01) |
| *G11C 11/4094* | (2006.01) |

(52) U.S. Cl.
CPC .......... *G06F 3/0629* (2013.01); *G06F 3/0673* (2013.01); *G11C 5/025* (2013.01); *G11C 7/1006* (2013.01); *G11C 7/1036* (2013.01); *G11C 8/12* (2013.01); *G11C 11/4082* (2013.01); *G11C 11/4087* (2013.01); *G11C 11/4091* (2013.01); *G11C 11/4093* (2013.01); *G11C 11/4096* (2013.01); *G11C 11/4094* (2013.01); *G11C 2211/4013* (2013.01)

(58) Field of Classification Search
CPC ............ G11C 11/4082; G11C 11/4087; G11C 11/4091; G11C 11/4093; G11C 11/4096; G11C 11/4094; G11C 2211/4013; G11C 7/065; G11C 2211/4061; G11C 2211/4067; G11C 7/1045; G06F 3/061; G06F 3/0616; G06F 3/0629; G06F 3/0673

See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,449,204 B1 | 9/2002 | Arimoto et al. |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |

(56) References Cited

U.S. PATENT DOCUMENTS

| | | | |
|---|---|---|---|
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Gullag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 11,195,568 B1* | 12/2021 | Atishay ................ G11C 29/42 |
| 11,282,563 B2* | 3/2022 | Lea ................ G11C 11/40615 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0021609 A1 | 2/2002 | Kitamoto et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0042333 A1 | 3/2004 | Shore et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0165465 A1 | 8/2004 | Kashiwazaki |
| 2004/0184335 A1 | 9/2004 | Afghahi et al. |
| 2004/0205289 A1 | 10/2004 | Srinivasan |
| 2004/0221098 A1 | 11/2004 | Ito et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0011596 A1 | 1/2007 | Suh |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0253268 A1 | 11/2007 | Kim et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0248972 A1 | 10/2009 | Ware et al. |
| 2009/0254697 A1 | 10/2009 | Akerib |
| 2010/0067296 A1 | 3/2010 | Li |
| 2010/0091582 A1 | 4/2010 | Vali et al. |
| 2010/0124138 A1 | 5/2010 | Lee et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0075947 A1 | 3/2012 | Kang et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0194857 A1 | 8/2013 | Miyamoto |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |

(56) References Cited

U.S. PATENT DOCUMENTS

| | | |
|---|---|---|
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062691 A1* | 3/2016 | Chang .................. G06F 3/0625 713/320 |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0163377 A1 | 6/2016 | Oh et al. |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2017/0148504 A1 | 5/2017 | Saifuddin et al. |
| 2021/0295901 A1* | 9/2021 | Hiscock ............ G11C 11/40611 |

FOREIGN PATENT DOCUMENTS

| | | |
|---|---|---|
| EP | 2026209 | 2/2009 |
| JP | 0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |
| WO | 2015187609 | 12/2015 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Application No. PCT/US2017/044089, dated Nov. 8, 2017, 11 pages.

Extended European Search Report and Written Opinion for related EP Application No. 17835246.4, dated Feb. 17, 2020, 8 pages.

\* cited by examiner

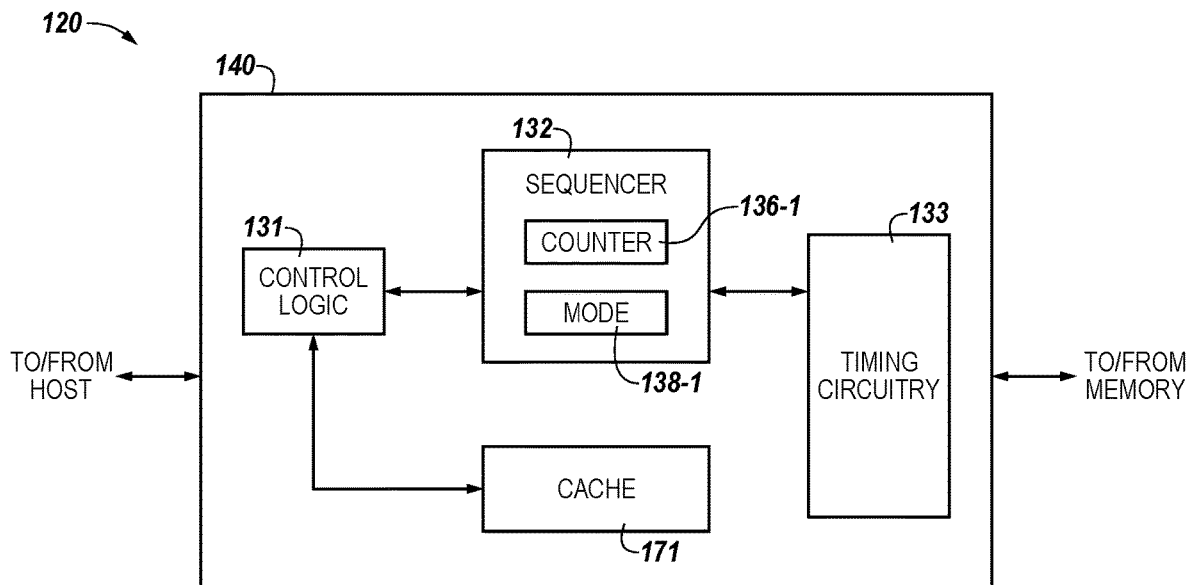
*Fig. 1E*
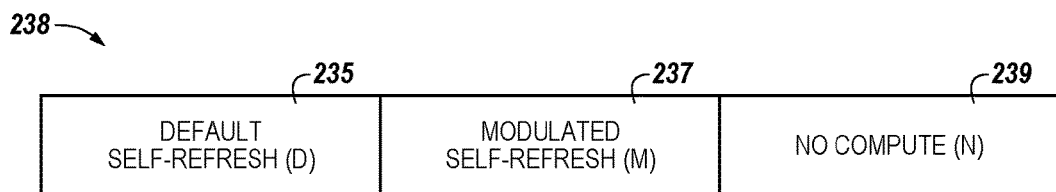
*Fig. 2*
| 334 | D 335 | M 337 | N 339 |
|---|---|---|---|
| 321-0 | 1 | 0 | 0 |
| 321-1 | 0 | 1 | 0 |
| 321-2 | 0 | 0 | 1 |
| 321-3 | 1 | 0 | 0 |
| 321-N | 0 | 0 | 1 |
*Fig. 3*

| 644 | 645 | 656 | 670 | 673 |
|---|---|---|---|---|
| A | B | NOT OPEN | OPEN TRUE | OPEN INVERT |
| 0 | 0 | 0 | 0 | 1 |
| 0 | 1 | 0 | 1 | 0 |
| 1 | 0 | 1 | 0 | 1 |
| 1 | 1 | 1 | 1 | 0 |

6-1

675

6-2

| | | | | | | | | | | |
|---|---|---|---|---|---|---|---|---|---|---|
| FF | 0 | 0 | 0 | 0 | 0 | 0 | 1 | 1 | 1 | ← 676 |
| FT | 0 | 0 | 0 | 1 | 1 | 1 | 0 | 0 | 0 | ← 677 |
| TF | 0 | 0 | 1 | 0 | 0 | 1 | 0 | 0 | 1 | ← 678 |
| TT | 0 | 1 | 0 | 0 | 1 | 0 | 0 | 1 | 0 | ← 679 |
| A | B | A | A*B | A*B̄ | A+B | B | AXB | A+B̄ | $\overline{AXB}$ | B̄ |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

680, 647

US 11,664,064 B2

APPARATUSES AND METHODS FOR OPERATIONS IN A SELF-REFRESH STATE

PRIORITY INFORMATION

This application is a Continuation of U.S. application Ser. No. 16/665,648, filed Oct. 28, 2019, which is a Divisional of U.S. application Ser. No. 15/222,514, filed Jul. 28, 2016, which issued as U.S. Pat. No. 10,468,087 on Nov. 5, 2019, the contents of which are included herein by reference.

TECHNICAL FIELD

The present disclosure relates generally to semiconductor memory and methods, and more particularly, to apparatuses and methods for performing operations by a memory device in a self-refresh state.

BACKGROUND

Memory devices are typically provided as internal, semiconductor, integrated circuits in various computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processing-in-memory device, in which a processor may be implemented internally and near to a memory (e.g., directly on a same chip as the memory array). A processing-in-memory device may save time by reducing and eliminating external communications and may also conserve power.

BRIEF DESCRIPTION OF THE DRAWINGS

FIG. 1E is a block diagram in greater detail of a controller in accordance with a number of embodiments of the present disclosure.

FIG. 2 is a block diagram of a mode register in accordance with a number of embodiments of the present disclosure.

FIG. 3 is a block diagram of a set of mode instructions, in a mode register, for banks of a memory device in accordance with a number of embodiments of the present disclosure.

DETAILED DESCRIPTION

Figure 1A:
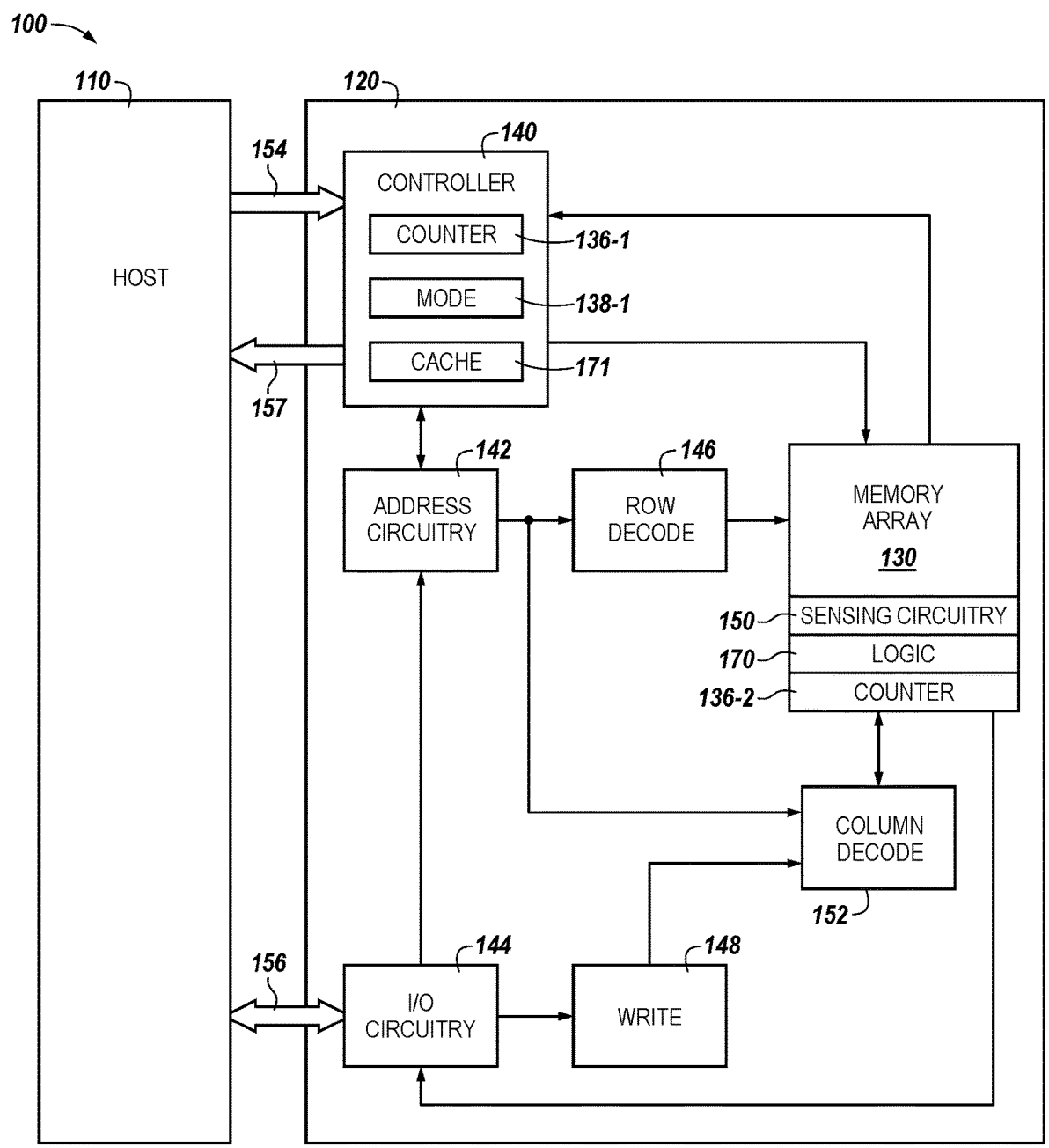
FIG. 1A is a block diagram of an apparatus in the form of a computing system including a memory device in accordance with a number of embodiments of the present disclosure.

The present disclosure includes apparatuses and methods for performing operations by a memory device in a self-refresh state. An example includes an array of memory cells and a controller coupled to the array of memory cells. The controller is configured to direct performance of compute operations, e.g., read, write, copy, and/or erase operations, on data stored in the array when the array of memory cells is in a self-refresh state.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 150 may reference element "50" in FIG. 1A, and a similar element may be referenced as 450 in FIG. 4. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, counter register 136, mode register 138, memory array 130, sensing circuitry 150, logic circuitry 170, and/or cache 171 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, etc.). A more detailed diagram of one example of host 110 interaction with the memory device 120 is described in association with FIG. 1D.

The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines and/or select lines, and columns coupled by sense lines, which may be referred to herein as data lines and/or digit lines. Although a single array 130 is shown in FIG. 1A, embodiments are not so limited. For instance, memory device 120 may include a number of arrays 130 (e.g., a number of banks of DRAM cells, NAND flash cells, etc.). Additionally, although not shown, a plurality of memory devices 120 can be coupled to host 110 via a respective plurality of memory channels.

The memory device 120 includes address circuitry 142 to latch address signals provided over a bus 156 through I/O circuitry 144. Bus 156 can serve as a data bus (e.g., an I/O bus) and as an address bus; however, embodiments are not so limited. Status and/or exception information can be provided from the controller 140 on the memory device 120 to host 110 through an interface, e.g., as shown at 141 and described in connection with FIG. 1D, which can, in some embodiments, include an output, e.g., out-of-band, bus 157. Address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Memory refresh involves periodically reading information, e.g. data, from an area of computer memory and rewriting the read data to the same area without modification, e.g., using sensing circuitry 150 as described in connection with FIG. 1A and elsewhere herein, for the purpose of preserving the data. Memory refresh is a background data maintenance process used during the operation of semiconductor memory devices, such as DRAM memory devices. In DRAM memory, for instance, each bit of data may be stored as the presence or absence of an electric charge on a capacitor that is part of a memory cell. As time passes, the charges in the capacitors of the memory cells may diminish, e.g., leak away, so without being refreshed the stored data would eventually be lost. To counteract this, circuitry external to the memory cells, e.g., the sensing circuitry, may periodically read the data stored in each cell and rewrite it, thereby restoring the charge on the capacitor to around its original level. Each memory refresh cycle refreshes succeeding areas of memory cells, e.g., rows of memory cells in a subarray of memory cells, thus refreshing all the memory cells in a consecutive cycle.

While a refresh cycle is occurring, the memory being refreshed has formerly not been available for compute operations. However, during compute operations commanded by a host, e.g., via a central processing unit (CPU), this "overhead" time may not be large enough to significantly slow down a compute operation. For instance, less than 0.4% of the time for a memory chip, e.g., a memory device or array, may be occupied by refresh cycles. In DRAM memory arrays, for example, the memory cells in each memory device may be divided into banks, e.g., as shown at 121-1, . . . , 121-7 and described in connection with FIG. 1D, which may be refreshed in parallel, saving further time.

Refresh circuitry may include a refresh counter, e.g., a counter register shown at 136 and described in connection with FIG. 1A and elsewhere herein. The counter register described herein controls a frequency of performance of a memory refresh cycle for the data stored in the memory cells when refresh signals are not received from a host 110, for example, during performance of compute operations in a self-refresh state. As described herein, a number of counter registers, e.g., as shown at 136-1 and 136-2 in FIG. 1A, may be coupled to the controller 140 and/or the array of memory cells 130. A counter register may contain addresses of the rows to be refreshed, which are applied to the chip's row address lines, and a timer that increments a counter to proceed through the rows at a pace of the refresh cycle, e.g., 4 clock cycles or 30 nanoseconds (ns) per row. For example, a double data rate (DDR) SDRAM memory device may have a refresh cycle time of 64 milliseconds (ms) and 4,096 rows, thereby yielding a refresh cycle interval of 15.6 microseconds (μs). In some embodiments, the 15.6 μs refresh cycle interval may be a default frequency, e.g., default mode, for a memory refresh cycle in a self-refresh state for data stored in the memory cells.

As described herein, selection of a different mode, e.g., from a mode register as shown at 138-1 and described in connection with FIG. 1A and elsewhere herein, may enable adjustment of the default frequency by changing a setting, e.g., via microcode instructions, in the counter register shown at 136-1 and/or 136-2 in FIG. 1A. A mode register may be configured to receive an indication, e.g. a microcode instruction from the host 110, to select from a plurality of modes for performance of the compute operations and/or logical operations on data stored in the memory cells when the array of memory cells is in a self-refresh state. The indication may cause a bit to be set, e.g., in microcode instructions stored in the mode register, to enable the performance of the compute operations and/or the logical operations using a selected mode. The mode register may be configured to receive the indication to select from the plurality of modes prior to the array of memory cells being in the self-refresh state, e.g., when there may be no interaction between the host 110 and the controller 140, as described further herein.

To enable faster performance of compute operations on data stored in the array when the array of memory cells is in the self-refresh state, a modulated self-refresh mode may be selected to cause the default frequency to be shortened from 15.6 μs to, for example, 7.8 μs. Performance of a compute operation may correspond to a time point at which data from a row in the memory device is read by sensing circuitry 150, e.g., a sense amplifier 406 of the sensing circuitry as described in connection with FIG. 4 and elsewhere herein. In the self-refresh state, the data may be read from each row at a frequency of the refresh cycle interval, which may be 15.6 μs in a default self-refresh mode.

A logical operation is intended to mean a processing-in-memory (PIM) operation performed using one bit vector processing, as described further herein. Such one bit vector processing may be performed with the sensing circuitry 150 including a sense amplifier and a compute component, as shown at 431 and described in connection with FIG. 4, where the compute component enables performance of the logical operation on the data. Examples of logical operations can include, but are not limited to, Boolean logical operations AND, OR, XOR, etc.

A counter register 136-1, or part of the counter register, may be associated with, e.g., coupled to, the circuitry of a controller, e.g., as shown at 140 and described in connection with FIG. 1A and elsewhere herein. Alternatively or in addition, a counter register 136-2, or part of the counter register, may be associated with the sensing circuitry 150 and/or logic 170 connected, e.g., coupled, to a memory array, e.g., as shown at 130 and described in connection with FIG. 1A and elsewhere herein.

During compute operations commanded by the host 110, signals may be transmitted between the host 110 and a memory device 120 and/or the controller 140 of the memory device 120. In some instances, a microprocessor associated with the host 110 may control refresh of the memory cells in the memory array 130 when they are interesting, e.g., other signals are being transmitted between them, with a timer triggering a periodic interrupt to run a subroutine that performs the refresh. Allowing the microprocessor to enter, for example, an energy-saving "sleep mode" when no operations are being performed involving input and/or output (I/O) of data and/or commands between the host 110 and the memory device 120, however, may stop the refresh process and result in loss of the data in memory.

Hence, memory devices 120, as described herein, may have a counter register 136-1 associated with, e.g., coupled to, the controller 140 and/or a counter register 136-2 associated with, e.g., coupled to, the memory array 120 itself. These internal counter registers may be used to generate refresh cycles when the memory device 120 is in a self-refresh state. The self-refresh state of the memory cells of the memory device 120 may correspond to the sleep mode of the host 110. For example, a counter register 136 may include an on-chip oscillator that internally generates refresh cycles such that a corresponding external counter, e.g., a timer associated with the host microprocessor, may be disconnected, e.g., shut down.

Such a sleep mode of the host, e.g., a CPU of the host, may be a low power state, e.g., mode, for a computing system in which associated memory devices, e.g., DDR SDRAM memory devices, among others, enter a self-refresh state. As described herein, this low power state may be used to perform operations by, e.g., in, memory devices in the self-refresh state. The controller 140 may be configured to direct, e.g., via a counter register 136, the performance of the compute operations and/or logical operations described herein at a rate corresponding to a frequency of performance of a memory refresh cycle for the data stored in the memory cells. The compute operations and/or logical operations may be performed on the data using sensing circuitry 150 coupled to the array of memory cells 130 during performance of a self-refresh operation by the sensing circuitry on the data.

In various embodiments, compute operations and/or logical operations, as described herein, may be performed while the memory device is in the self-refresh state even though the clock rate of the compute and/or logical operations may be reduced by, for example, a factor of 1000 times, e.g., from around 15 ns to around 15 μs. This reduced rate for performing such operations may be acceptable because a functionality that is operated during the self-refresh state may be a functionality that can operate with high latency, as described further herein, and/or that does not involve I/O of data and/or commands between the host 110 and the memory device 120.

The counter registers 136 and/or mode registers 138 described herein may include one or more separate registers, e.g., separate and/or in addition to other array control registers such as DDR registers to a DRAM array. For example, counter registers 136 and/or mode registers 138 may be coupled to an interface (e.g., 141 in FIG. 1D) of the memory device 120 to the host 110. The counter registers 136 and/or mode registers 138 may also be used to control the operation of an array 130 of the memory device 120, e.g., a DRAM array, and/or the controller 140. As such, the counter registers 136 and/or mode registers 138 may be coupled to the I/O circuitry 144 and/or controller 140. In various embodiments, the counter registers 136 and/or mode registers 138 may be memory mapped I/O registers. The memory mapped I/O registers can be mapped to a plurality of locations in memory where microcode instructions are stored. The memory mapped I/O registers may thus be configured to control compute operations performed in the memory, e.g., in various banks of the memory, in a self-refresh state based upon stored bits in microcode instructions. In some embodiments, the counter registers 136 and/or mode registers 138 may include a block of static random access memory (SRAM) cells. Counter registers 136 and/or mode registers 138 may be coupled to DDR registers to further control the operation of the DRAM array. Embodiments are not limited to the examples given herein.

Controller 140 may decode signals provided by address and control (A/C) bus 154 from the host 110. According to various embodiments, the controller 140 can be a reduced instruction set computer (RISC) type controller operating on 32 and/or 64 bit length instructions. These signals can include chip enable signals, read enable signals, write enable signals, and address latch signals, among other signals, that are used to control operations performed on the memory array 130, including data read, data write, and data erase operations. In various embodiments, the controller 140 is responsible for executing instructions from the host 110. The controller 140 can include firmware in the form of executable microcode instructions and/or hardware in the form of an application specific integrated circuit (ASIC) and transistor circuitry. As described herein, the A/C bus 154 and the output bus 157 coupled to the host 110 to send signals to the controller 140 and/or receive signals from the controller 140, along with the I/O circuitry 144 used for bi-directional data communication with host 110 over the data bus 156, may be idle during the performance of the compute operations and/or logical operations in the self-refresh state.

In various embodiments, the controller 140 is responsible for executing instructions from the host 110 and sequencing access to the array 130, among other functions. For example, executing instructions from host 110 can include performing operations, e.g., by executing microcode instructions, using processing resources corresponding to the counter registers 136, mode registers 138, sensing circuitry 150, and/or logic 170, as described further herein. The controller 140 can include a state machine, e.g., firmware and/or hardware in the form of an ASIC, a sequencer, and/or some other type of controlling circuitry. In various embodiments the controller 140 can control shifting data, e.g., right or left, in an array 130.

In the example shown in FIG. 1A, the controller 140 includes a cache 171, which may store (e.g., at least temporarily) microcode instructions, as described herein, that are executable, e.g., by a processing resource associated with controller 140 and/or host 110, to perform compute operations. In the example shown in FIG. 1A, the controller 140 can include and/or be associated with a counter register 136-1. In addition to including a timer, e.g., a clock and/or oscillator, for control of timing of refresh operations and/or compute operations in the self-refresh state, the counter register 136-1 can include a reference to data stored in the memory array 130. The reference in counter register 136-1 can be an operand in compute operations performed on the memory device 120. The reference in counter register 136-1 can updated while performing compute operations so that data stored in the memory array 130 can be accessed. A more detailed diagram of one example of controller 140 is described in association with FIG. 1E.

As described further below, in a number of embodiments, the sensing circuitry 150 can comprise a number of sense amplifiers and a number of compute components, which may serve as an accumulator, and can be used to perform various compute operations, e.g., to perform logical operations on data associated with complementary sense lines. In a number of embodiments, storage locations, e.g., latches, corresponding to the compute components can serve as stages of a shift register. For example, clock signals can be applied to the compute components to shift data from one compute component to an adjacent compute component.

In a number of embodiments, the sensing circuitry 150 can be used to perform logical operations using data stored in array 130 as inputs and store the results of the logical operations back to the array 130 without transferring data via a sense line address access. e.g., without firing a column decode signal. As such, various compute functions can be performed using, and within, sensing circuitry 150 rather than (or in association with) being performed by processing resources external to the sensing circuitry, e.g., by a processor associated with host 110 and/or other processing circuitry, such as ALU circuitry, located on device 120, e.g., on controller 140 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines. In contrast, in a number of embodiments of the present disclosure, sensing circuitry 150 may be configured to perform logical operations on data stored in memory array 130 and store the result back to the memory array 130 without enabling an I/O line, e.g., a local I/O line, coupled to the sensing circuitry 150. Additional logic circuitry 170 can be coupled to the sensing circuitry 150 and can be used to store, e.g., cache and/or buffer, results of operations described herein.

The sensing circuitry 150 can be formed on pitch with the memory cells of the array. In some instances, circuitry of processing resource(s), e.g., a compute engine, may not conform to pitch rules associated with a memory array. For example, the memory cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and/or memory density, for example. A number of embodiments of the present disclosure can include the control circuitry and/or the sensing circuitry, e.g., including sense amplifiers and/or compute components, as described herein, being formed on pitch with the memory cells of the array and being configured to, e.g., being capable of performing, compute functions, e.g., memory and/or PIM operations, on pitch with the memory cells. The sensing circuitry can, in some embodiments, be capable of performing data sensing and compute functions and at least temporary storage, e.g., caching, of data local to the array of memory cells.

PIM capable device operations can use bit vector based operations. As used herein, the term "bit vector" is intended to mean a number of bits on a bit vector memory device, e.g., a PIM device, stored in a row of an array of memory cells and/or in sensing circuitry. Thus, as used herein a "bit vector operation" is intended to mean an operation that is performed on a bit vector that is a portion of virtual address space and/or physical address space, e.g., used by a PIM device. In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space. For example, a row of virtual address space in the PIM device may have a bit length of 16K bits, e.g., corresponding to 16K complementary pairs of memory cells in a DRAM configuration. Sensing circuitry 150, as described herein, for such a 16K bit row may include a corresponding 16K processing elements, e.g., compute components as described herein, formed on pitch with the sense lines selectably coupled to corresponding memory cells in the 16 bit row. A compute component in the PIM device may operate as a one bit vector processing element on a single bit of the bit vector of the row of memory cells sensed by the sensing circuitry 150, e.g., sensed by and/or stored in a sense amplifier 406 paired with the compute component 431, as described further in connection with FIG. 4 and elsewhere herein.

As such, in a number of embodiments, circuitry external to array 130 and sensing circuitry 150 is not needed to perform compute functions as the sensing circuitry 150 can perform the appropriate memory and/or logical operations in order to perform such compute functions without the use of an external processing resource. Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform operations, e.g., to execute instructions, in addition to operations performed by an external processing resource, e.g., host 110. For instance, host 110 and/or sensing circuitry 150 may be limited to performing only certain logical operations and/or a certain number of logical operations.

Enabling an I/O line can include enabling, e.g., turning on, a transistor having a gate coupled to a decode signal, e.g., a column decode signal, and a source/drain coupled to the I/O line. However, embodiments are not limited to performing operations using sensing circuitry, e.g., 150, without enabling column decode lines of the array. Whether or not local I/O lines are used in association with performing operations via sensing circuitry 150, the local I/O line(s) may be enabled in order to transfer a result to a suitable location other than back to the array 130, e.g., to an external register.

Figure 1B:
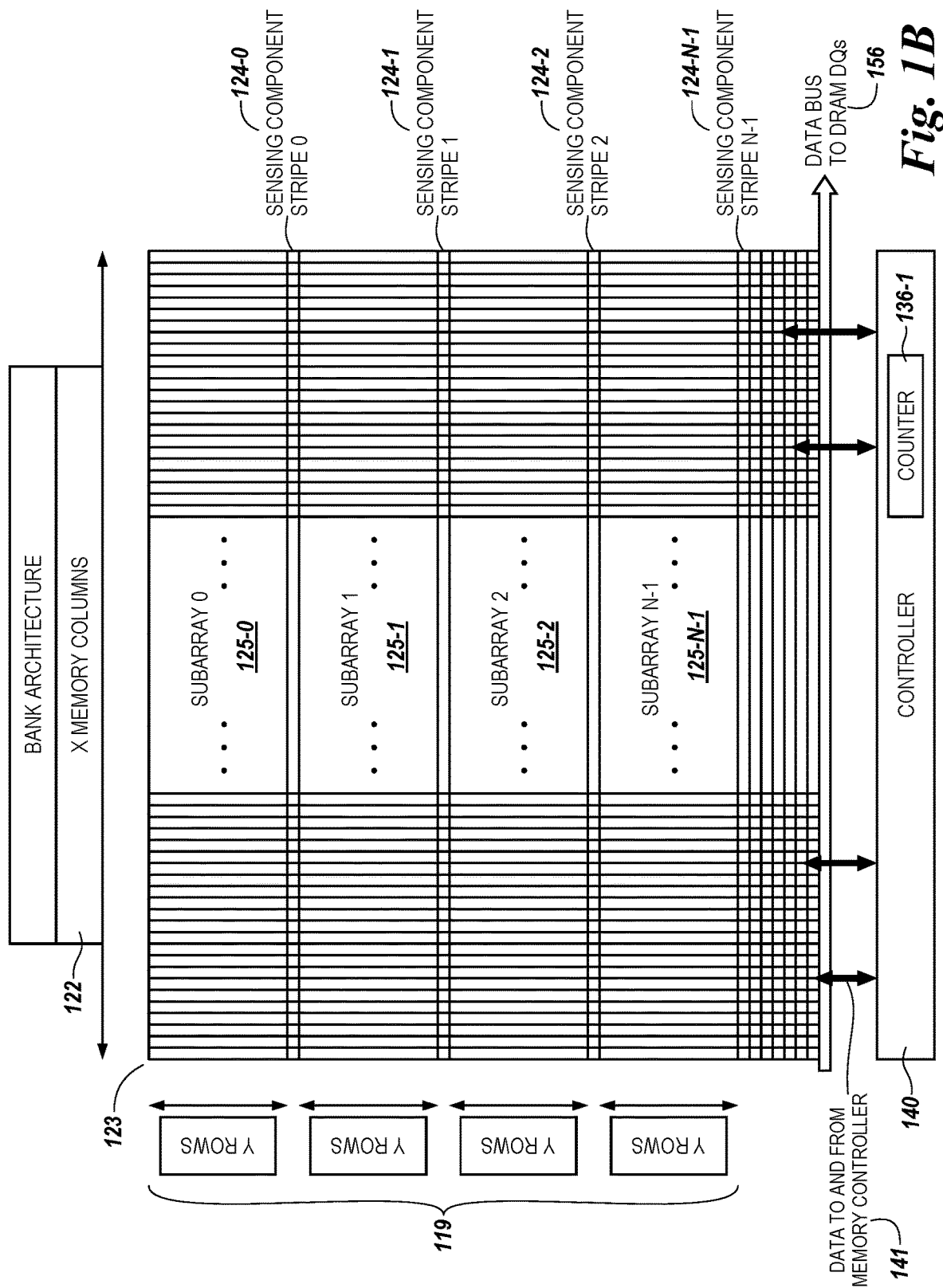
FIG. 1B is a block diagram of a bank section of a memory device in accordance with a number of embodiments of the present disclosure.

FIG. 1B is a block diagram of a bank section 123 of a memory device 120 in accordance with a number of embodiments of the present disclosure. For example, bank section 123 can represent an example section of a number of bank sections of a bank of a memory device, e.g., not shown bank section 0, bank section 1, . . . , bank section M. As shown in FIG. 1B, a bank section 123 can include a plurality of memory columns 122 shown horizontally as X, e.g., 16,384 columns in an example DRAM bank and bank section. Additionally, the bank section 123 may be divided into subarray 0, subarray 1, . . . , subarray N−1, e.g., 128 subarrays, shown at 125-0, 125-1, . . . , 125-N−1, respectively, that are separated by amplification regions configured to be coupled to a data path, e.g., as shown at 144 in FIG. 1C. As such, the subarrays 125-0, 125-1, . . . , 125-N−1 can each have amplification regions shown 124-0, 124-1, . . . , 124-N−1 that correspond to sensing component stripe 0, sensing component stripe 1, . . . , and sensing component stripe N−1, respectively.

Each column 122 is configured to be coupled to sensing circuitry 150, as described in connection with FIG. 1A and elsewhere herein. As such, each column in a subarray can be coupled individually to a sense amplifier and/or compute component that contribute to a sensing component stripe for that subarray. For example, as shown in FIG. 1B, the bank section 123 can include sensing component stripe 0, sensing component stripe 1, . . . , sensing component stripe N−1 that each have sensing circuitry 150 with sense amplifiers and/or compute components. The sense amplifiers and/or compute components can, in various embodiments, be used as registers, cache and data buffering that can be coupled to each column 122 in the subarrays 125-0, 125-1, . . . , 125-N−1. The compute component within the sensing circuitry 150 coupled to the memory array 130, as shown in FIG. 1A, can complement the cache 171 associated with the controller 140.

Each of the of the subarrays 125-0, 125-1, . . . , 125-N−1 can include a plurality of rows 119 shown vertically as Y, e.g., each subarray may include 512 rows in an example DRAM bank. Example embodiments are not limited to the example horizontal and vertical orientation of columns and rows described herein or the example numbers thereof.

As shown in FIG. 1B, the bank section 123 can be associated with, e.g., coupled to, controller 140. The controller 140 shown in FIG. 1B can, in various examples, represent at least a portion of the functionality embodied by and contained in the controller 140 shown in FIG. 1A. The controller 140 can direct, e.g., control, input of control signals based on commands and data to the bank section and output of data from the bank section, e.g., to the host 110, along with control of data movement in the bank section, as described herein. The bank section can include a data bus 156, e.g., a 64 bit wide data bus, to DRAM DQs, which can correspond to the data bus 156 described in connection with FIG. 1A. The controller 140 may include, or be associated with, the counter register 136-1 described in association with FIG. 1A. In some embodiments, a counter register, e.g., as shown at 136-2 and described in association with FIG. 1A, may be associated with the memory of a bank or bank section, e.g., by being coupled to data bus 156 or otherwise capable of receiving instructions form host 110.

Figure 1C:
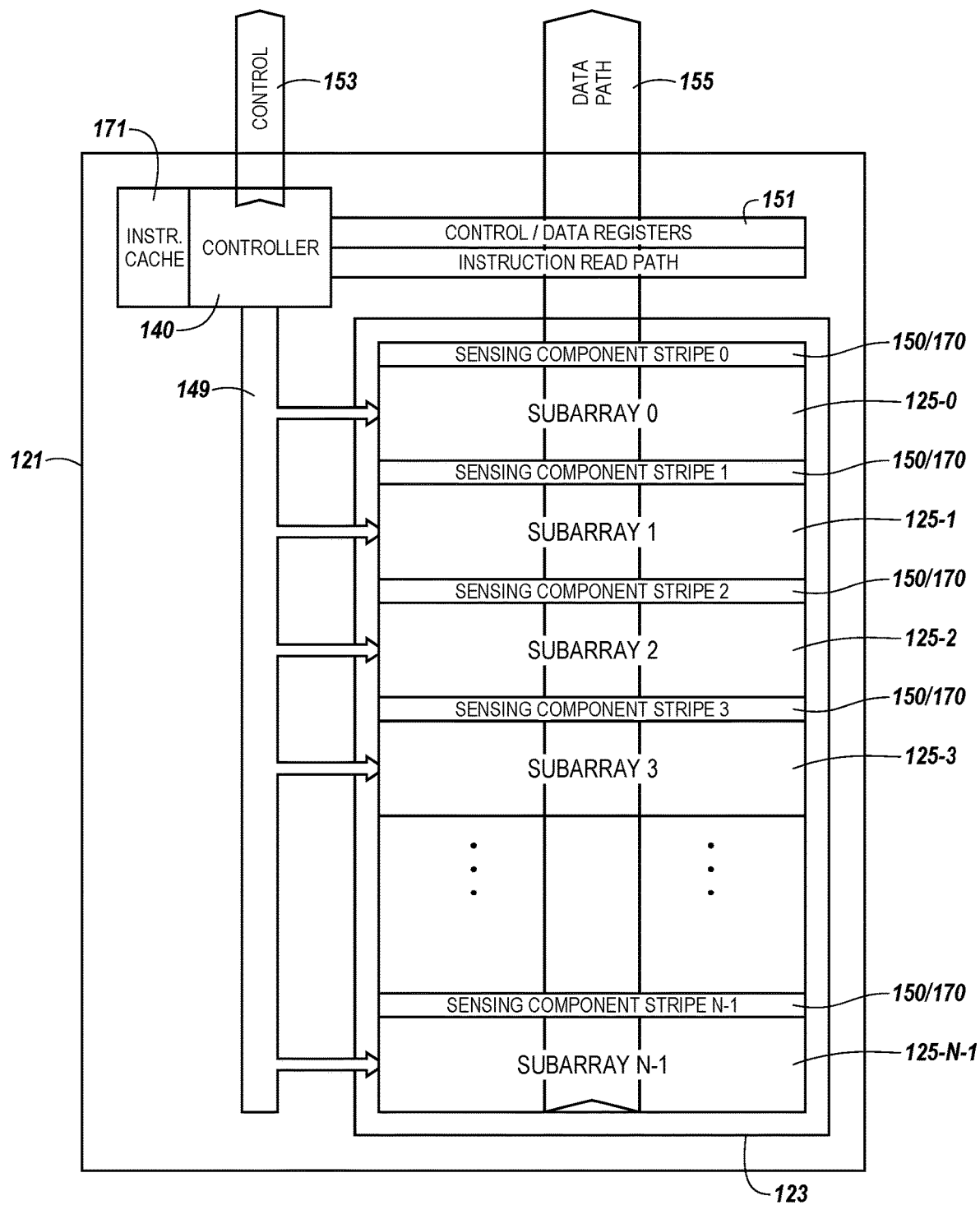
FIG. 1C is a block diagram of a bank of a memory device in accordance with a number of embodiments of the present disclosure.

FIG. 1C is a block diagram of a bank 121 of a memory device in accordance with a number of embodiments of the present disclosure. For example, bank 121 can represent an example bank of a memory device, e.g., banks 0, 1, . . . , 7 as shown and described in connection with FIG. 1D. As shown in FIG. 1C, a bank 121 can include an address/control (A/C) path 153, e.g., a bus, coupled a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank 121 can include a plurality of bank sections, e.g., bank section 123, in a particular bank 121. As further shown in FIG. 1C, a bank section 123 can be subdivided into a plurality of subarrays, e.g., subarray 0, subarray 1, . . . , subarray N−1 shown at 125-1, 125-2, . . . , 125-N−1, respectively separated by sensing component stripes 124-0, 124-1, . . . , 124-N−1, as shown in FIG. 1B. The sensing component stripes can include sensing circuitry and logic circuitry 150/170, as shown in FIG. 1A and described further in connection with FIGS. 4-5.

Figure 1D:
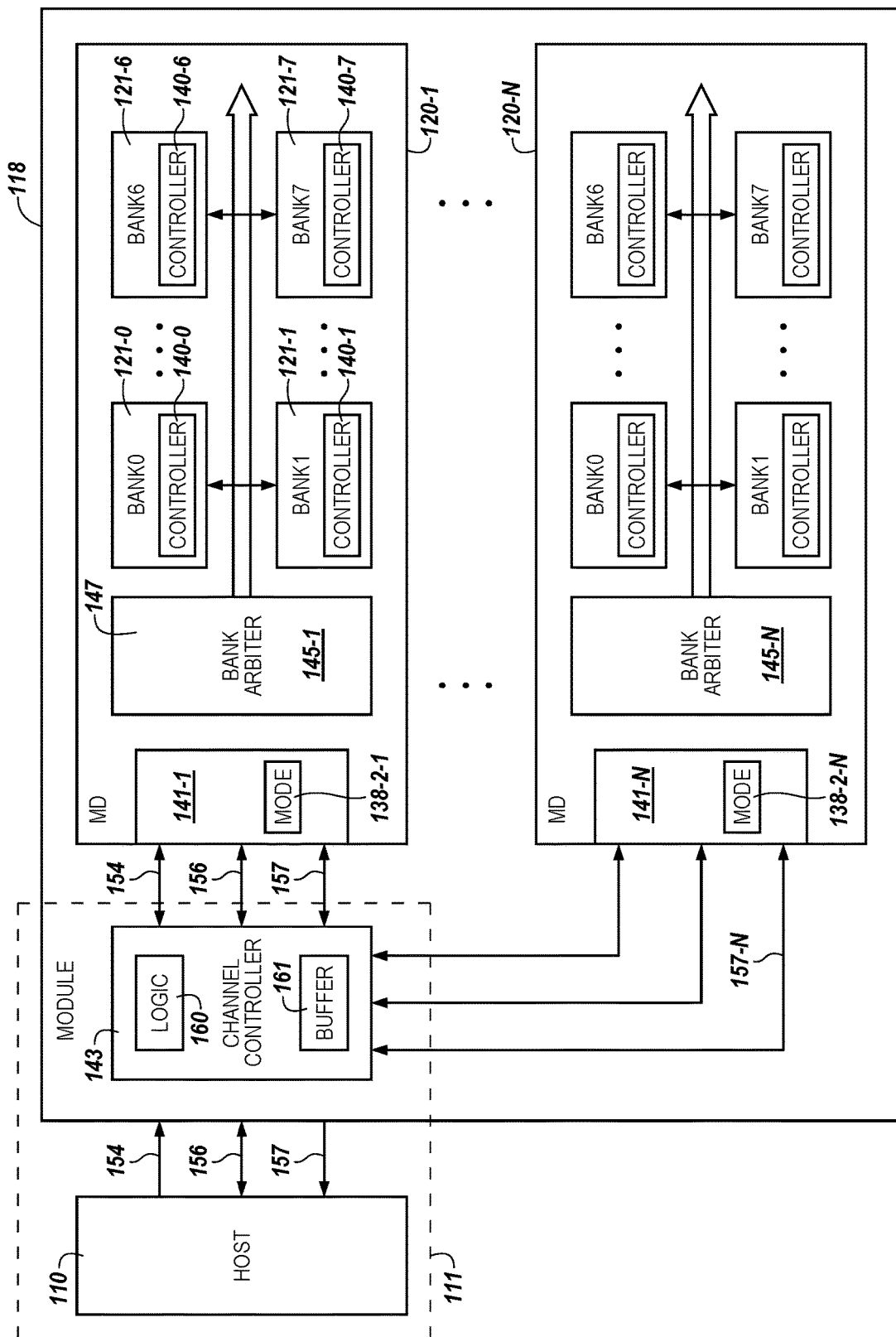
FIG. 1D is another block diagram of an apparatus in the form of a computing system including a memory device in accordance with a number of embodiments of the present disclosure.

Bank 121 can, for example, represent an example bank of a memory device 120 such one of the plurality of banks, e.g., banks 121-0, . . . , 121-7, shown in FIG. 1D. As shown in FIG. 1C, a bank 121 can include an additional address and control path 153 coupled the controller 140. The controller 140 shown in FIG. 1C can, for example, include at least a portion of the functionality described in connection with the controller 140 shown in FIGS. 1A and 1B. Also, as shown in FIG. 1C, a bank 121 can include an additional data path 155 coupled to a plurality of control/data registers 151 in an instruction, e.g., microcode instructions, and read path. The data path 155 may additionally be coupled to a plurality of bank sections, e.g., bank section 123, in a particular bank 121.

As shown in the example embodiment of FIG. 1C, a bank section 123 can be further subdivided into a plurality of subarrays 125-1, 125-2, . . . , 125-N−1 and separated by of plurality of sensing circuitry and logic 150/170. In one example, a bank section 123 may be divided into sixteen (16) subarrays. However, embodiments are not limited to this example number. An example embodiment, of such sensing circuitry 150 is described further in connection with FIGS. 4-5.

In some embodiments, the controller 140 may be configured to provide instructions (control signals based on commands) and data to a plurality of locations of a particular bank 121 in the memory array 130 and to the sensing component stripes 124-0, 124-1, . . . , 124-N−1 via a write path 149 and/or the data path 155 with control and data registers 151. For example, the control and data registers 151 can include instructions to be executed using by the sense amplifiers and the compute components of the sensing circuitry 150 in the sensing component stripes 124-0, 124-1, . . . , 124-N−1. FIG. 1C illustrates an instruction cache 171 associated with the controller 140 and coupled to the write path 149 to each of the subarrays 125-0, . . . , 125-N−1 in the bank 121.

FIG. 1D is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment, the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via A/C bus 154, as described in FIG. 1A, which in turn can be coupled to the host 110.

The channel controller 143 can also be coupled to each of the plurality of memory devices, 120-1, . . . , 120-N via a data bus 156, as described in FIG. 1A, which in turn can be coupled to the host 110. In addition, the channel controller 143 can be coupled to each of the plurality of memory devices 120-1, . . . , 120-N, for example, via bus 157 associated with an interface 141. As used herein, the term channel controller is intended to mean logic in the form of firmware, e.g., microcode instructions, and/or hardware, e.g., an ASIC, to implement one or more particular functions. One example of a channel controller may include a state machine. Another example may include an embedded processing resource. The channel controller 143 includes logic to handle I/O tasks to a device.

As shown in FIG. 1D, the channel controller 143 can receive the status and exception information from the interface 141, e.g., also referred to herein as a status channel interface, associated with a bank arbiter 145 in each of the plurality of memory devices 120-1, . . . , 120-N. In various embodiments, a plurality of interfaces 141-1, . . . , 141-N of the respective plurality of memory devices 120-1, . . . , 120-N may each be configured to include, or be associated with, a mode register 138-2-1, . . . , 138-2-N. As shown at 138-1 and described in connection with FIG. 1A and in greater detail in connection with FIGS. 2 and 3, each mode register enables selection of a mode, from a plurality of modes, that may enable adjustment from a default self-refresh frequency, e.g., a default self-refresh mode, by changing a setting, e.g., via microcode instructions, in the counter register, e.g., as shown at 136-1 and/or 136-2 in FIG. 1A.

In the example of FIG. 1D, each of the plurality of memory devices 120-1, . . . , 120-N can include a respective bank arbiter 145-1, . . . , 145-N to sequence control and data with a plurality of banks, e.g., banks 121-0, . . . , 121-7, etc., in each of the plurality of memory devices 120-1, . . . , 120-N. Each of the plurality of banks, e.g., 121-0, . . . , 121-7, can include a controller 140 and other components, including an array of memory cells 130, sensing circuitry 150, logic circuitry 170, etc., as described in connection with FIG. 1A.

For example, each of the plurality of banks, e.g., 121-0, . . . , 121-7, in the plurality of memory devices 120-1, . . . , 120-N can include address circuitry 142 to latch address signals provided over a data bus 156 (e.g., an I/O bus) through I/O circuitry 144. Status and/or exception information can be provided from the controller 140 on the memory device 120 to the channel controller 143, using the bus 157, which in turn can be provided from the plurality of memory devices 120-1, . . . , 120-N to the host 110 and vice versa.

For each of the plurality of banks, e.g., 121-0, . . . , 121-7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page, e.g., row, of data from the memory array 130. The I/O circuitry 144 can be used for bi-directional data communication with host 110 over the data bus 156. The write circuitry 148 is used to write data to the memory array 130 and the bus 157 can be used to report status, exception and other data information to the channel controller 143.

The channel controller 143 can include one or more local buffers 161 to store microcode instructions and can include logic 160 to allocate a plurality of locations, e.g., subarrays or portions of subarrays, in the arrays of each respective bank to store microcode instructions, e.g., bank commands and arguments, PIM commands, etc., for the various banks associated with the operation of each of the plurality of memory devices 120-1, . . . , 120-N. The channel controller 143 can send microcode instructions, e.g., bank commands and arguments, PIM commands, status and exception information, etc., to the plurality of memory devices 120-1, . . . , 120-N to store those microcode instructions within a given bank of a memory device. For example, the channel controller 143 and/or bank arbiter 145 may send, e.g., as received from host 110, mode selection instructions to mode registers 138-2-1, . . . , 138-2-N associated with, e.g., via interfaces 141-1, . . . , 141-N, the respective plurality of banks 121-1, . . . , 121-7 in each of the respective plurality of memory devices 120-1, . . . , 120-N.

As described above in connection with FIG. 1A, the memory array 130 for the memory devices 120-1, . . . , 120-N and/or the banks 121-0, . . . , 121-7 can be a DRAM array, SRAM array, STT RAM array, PCRAM array, TRAM array, RRAM array, NAND flash array, and/or NOR flash array, for instance. In some embodiments, the array 130 can comprise memory cells arranged in rows coupled by access lines (which may be referred to herein as word lines or select lines) and columns coupled by sense lines, which may be referred to herein as data lines or digit lines.

FIG. 1E is a block diagram in greater detail of the controller 140 shown in FIG. 1A, and elsewhere herein, in accordance with a number of embodiments of the present disclosure. In the example shown in FIG. 1E, the controller 140 is shown to include control logic 131, sequencer 132, and timing circuitry 133 as part of a controller 140 of a memory device 120. Memory device 120 can include a controller 140 on each bank of the memory device and can be referred to as a bank process control unit (BPCU)

In the example of FIG. 1E, the memory device 120 may include an interface 141 to receive data, addresses, control signals, and/or commands at the memory device 120. In various embodiments, the interface 141 may be coupled to a bank arbiter 145 associated with the memory device 120. The interface 141 may be configured to receive commands and/or data from the host 110. The bank arbiter 145 may be coupled to the plurality of banks, e.g., 121-0, . . . , 121-7, in the memory device 120.

In the example shown in FIG. 1E, the control logic 131 may be in the form of a microcoded engine responsible for fetching and executing machine instructions, e.g., microcode instructions, from an array of memory cells, e.g., an array as array 130 and/or host 110 in FIG. 1A. The sequencer 132 may also be in the form of a number of microcoded engines and/or ALU circuitry. Alternatively, the control logic 131 may be in the form of a very large instruction word (VLIW) type processing resource and the sequencer 132, and the timing circuitry 133 may be in the form of state machines and transistor circuitry.

The control logic 131 may receive microcode instructions from cache 171 and/or host 110 and may decode microcode instructions into function calls, e.g., microcode function calls (uCODE), implemented by the sequencers 132. The microcode function calls can be the operations that the sequencer 132 receives and executes to cause the memory device 120 to perform particular compute and/or logical operations using the sensing circuitry such as sensing circuitry 150 in FIG. 1A. The timing circuitry 133 may provide timing to coordinate performance of the compute and/or logical operations and be responsible for providing conflict free access to the arrays such as array 130 in FIG. 1A.

In the example shown in FIG. 1E, the sequencer 132 includes a counter register 136-1. Counter register 136-1 can include a reference to data stored in a memory array. The reference in register 136-1 can be used as an operand in compute and/or logical operations performed on a memory device. The reference in the counter register 136-1 can be updated by iterating through indexes of the reference that access data stored in a memory array. For example, the reference can include a row index that is updated by iterating through a number of row indexes where a first row index is used to access data in a first row of a memory array and a second row index is used to access data in a second row of a memory array, and so on. The reference can be updated so that compute and/or logical operations can access and use data based on the location of the data in the memory array. Also, the reference can be updated so that operations can access data that is located in a number of locations in the memory array. In some embodiments, the counter register 136-1 may be part of, or operate in association with, the timing circuitry 133 to control timing, e.g., frequency, of the refresh operations performed in the self-refresh state described herein. In various embodiments, the controller 140 may include and/or be coupled to a mode register 138-1, as described further in connection with FIGS. 2 and 3. For example, the mode register 138-1 may be part of the sequencer 132, as shown in FIG. 1E, although embodiments are not so limited. For instance, the mode register 138-1 may be part of the control logic 131 in some embodiments.

As described in connection with FIG. 1A, the controller 140 may be coupled to sensing circuitry 150 and/or additional logic circuitry 170, including cache, buffers, sense amplifiers, extended row address (XRA) latches, and/or registers, associated with arrays of memory cells via control lines and data paths shown in FIGS. 1A-1D. As such, sensing circuitry 150 and logic 170 shown in FIG. 1A can be associated with, e.g., coupled to, the arrays of memory cells 130 using data I/Os. The controller 140 may control regular DRAM compute operations for the arrays such as a read, write, copy, and/or erase operations, etc. Additionally, however, microcode instructions retrieved and executed by the control logic 131 and the microcode function calls received and executed by the sequencer 132 can cause sensing circuitry 150 shown in FIG. 1A to perform additional logical operations such as addition, multiplication, or, as a more specific example, Boolean operations such as an AND, OR, XOR, etc., which are more complex than regular DRAM read and write operations. Hence, in this memory device 120 example, microcode instruction execution, compute operations, and/or logical operations may be performed on the memory device 120.

As such, the control logic 131, sequencer 132, and timing circuitry 133 may operate to generate sequences of operation cycles for a DRAM array. In the memory device 120 example, each sequence may be designed to perform operations, such as a Boolean logical operations AND, OR, XOR, etc., which together achieve a specific function. For example, the sequences of operations may repetitively perform a logical operation for a one (1) bit add in order to calculate a multiple bit sum. Each sequence of operations may be fed into a first in/first out (FIFO) buffer coupled to the timing circuitry 133 to provide timing coordination with the sensing circuitry 150 and/or additional logic circuitry 170 associated with the array of memory cells 130, e.g., DRAM arrays, shown in FIG. 1A.

In the example memory device 120 shown in FIG. 1E, the timing circuitry 133 may provide timing and provide conflict free access to the arrays from, for example, four (4) FIFO queues. In this example, one FIFO queue may support array computation, one may be for Instruction fetch, one for microcode (e.g., uCODE) instruction fetch, and one for DRAM I/O. The timing circuitry 133 may cooperate with the counter register 136-1 and/or the mode register 138-1 to generate the refresh cycles in the self-refresh state. Both the control logic 131 and the sequencer 132 can generate status information, which can be routed back to the bank arbiter via a FIFO interface. The bank arbiter may aggregate this status data and report it back to a host 110 via the interface 141.

FIG. 2 is a block diagram of a mode register 238 in accordance with a number of embodiments of the present disclosure. A mode register 238, as described herein, may be further configured to include in a plurality of selectable modes. For example, mode register 238 can include a default self-refresh mode (D) 235, a modulated self-refresh mode (M) 237, and a mode in which computations are not allowed in the self-refresh state (N) 239, among other possible modes. Mode register 238 can include a reference to data in memory arrays that includes a row index, a column index, and a subarray index, among other information, to indicate the particular locations in the memory arrays the selected self-refresh modes are to be applied. As described with regard to FIG. 3, the selected modes and/or a memory location to which the selected mode is to be applied may be stored as a set in the mode register 238.

The D mode 235 in the mode register 238 can be used for performance of the compute and/or logical operations at a rate corresponding to the default frequency for a memory refresh cycle for the data stored in the memory cells, as described above. The D mode 235 can be used to refresh data based on the row in the memory array in which the data is stored, as determined by the reference. In some embodiments, a refresh cycle interval of around 15 μs may be a default frequency, e.g., the default self-refresh mode, for a memory refresh cycle in the self-refresh state for data stored in the memory cells. In the self-refresh state, the data may be read from each row, e.g., to perform computation and/or logical operations, at a frequency of the refresh cycle interval, which may be around 15 μs in the default self-refresh mode.

The N mode 239 in the mode register 238 may be selected to prevent computations, e.g., computation and/or logical operations, from being performed in the self-refresh state. N mode 239 may, for example, be selected to protect data in particular locations in the memory, to specify by exclusion which locations in the memory are usable for computations in the self-refresh state, and/or to ensure that a mobile device including the memory devices described herein remains in a state of relatively reduced power consumption, among other possible reasons for selecting N mode 239.

The M mode 237 in the mode register 238 can be selected to enable adjustment of the D mode 235 and/or the N mode 239 by changing a refresh frequency setting, e.g., via microcode instructions, in the counter register, e.g., as shown at 136-1 in FIG. 1E. Compute operations and/or logical operations may be performed at a rate different from the default frequency for a memory refresh cycle for the data stored in the memory cells, where the compute operations being performed at the rate different from the default frequency may be enabled by adjustment of the memory refresh cycle frequency. For example, to enable faster performance of computation operations on data stored in the array when the array of memory cells is in the D mode of the self-refresh state, the M mode may be selected to cause the refresh frequency to be shortened from, for example, 15.6 μs to 7.8 μs. There may be a plurality of M modes whereby the refresh frequency of the D mode 235, e.g., 15.6 μs and/or the refresh frequency of N mode, e.g., 15.6 μs may be adjusted to a range of refresh frequencies that enable computation operations to be performed faster or slower than the default rate of computation operations.

FIG. 3 is a block diagram of a set 334 of mode instructions for banks of a memory device in accordance with a number of embodiments of the present disclosure. A mode register 238 may be selectably coupled to each bank, e.g., banks 121-0, . . . , 121-7 in each memory device 120, as shown in FIG. 1D. The mode register 238 may be configured to receive the indication to select, from the plurality of modes, a mode for a bank. As shown below, in various embodiments, a first mode selected for a first bank may be different from a second mode selected for a second bank.

The set 334 of mode instructions may be saved in a number of mode registers. For example, the set 334 of mode instructions may be saved in mode register 138-1 in the controller 140 described in connection with FIGS. 1A and 1E and/or in mode registers 138-2-1, . . . 138-2-N in interfaces 141-1, . . . , 141-N of the respective plurality of memory devices 120-1, . . . , 120-N described in connection with FIG. 1D. By way of example, the set 334 of mode instructions may be saved in the form of a table in which the various selectable modes, e.g., D mode 335, M mode 337, and/or mode N 339 described in connection with FIG. 2, may be present on one axis. In some embodiments, the banks of the memory device to which a selected mode may be applied can be present on another axis of the table. For example, a plurality of banks, e.g., banks 321-0, . . . , 121-N, corresponding to a particular memory device 120, as described in connection with FIG. 1D, may be present on a vertical axis of the table and the various selectable modes may be present on a horizontal axis of the table, although embodiments are not limited to this configuration.

The set 334 of mode instructions for banks 321-0, . . . , 121-N of the memory device 120 can include D mode 335 being selected for bank 321-0 via bits in microcode instructions. For example, a microcode instruction may include a bit that causes a D mode 335 column to store a data unit, e.g., 1 in binary, corresponding to a row to designate bank 321-0 and bits that cause M mode 337 and N mode 339 columns to store a different data unit, e.g., 0 in binary, corresponding to the row to designate bank 321-0. As such, the microcode instructions can enable selection of the D mode 335, e.g., the default mode for a memory refresh cycle in the self-refresh state, for data stored in the memory cells of bank 321-0.

The same microcode instruction or a different microcode instruction may include a bit that causes an M mode 337 column to store a data unit corresponding to a row to designate bank 321-1 and bits that cause D mode 335 and N mode 339 columns to store a different data unit corresponding to the row to designate bank 321-1. As such, the microcode instructions can enable selection of the M mode 337, e.g., the modulated mode for adjustment of the memory refresh cycle relative to the D mode 335 and/or the N mode 339, for data stored in the memory cells of bank 321-1.

The same microcode instruction or a different microcode instruction may include a bit that causes an N mode 339 column to store a data unit corresponding to a row to designate bank 321-2 and bits that cause D mode 335 and M mode 337 columns to store a different data unit corresponding to the row to designate bank 321-2. As such, the microcode instructions can enable selection of the N mode 339, e.g., to prevent computations from being performed in the self-refresh state, for data stored in the memory cells of bank 321-2.

In some embodiments, the microcode instructions just described may be sent by the host 110. Updated microcode instructions, e.g., to change modes selected for particular banks, also may be sent by the host 110. In various embodiments, the microcode instructions may be decoded by the controller 140 and setting of values in the mode register may be directed by the controller 140 and/or the microcode instructions may be sent directly to the mode register to set the modes for the banks. In some embodiments, the row, column, and/or subarray indexes of a counter register 136 may be utilized to further specify to which row, column, and/or subarray in a particular bank the selected mode is to be applied.

Figure 4:
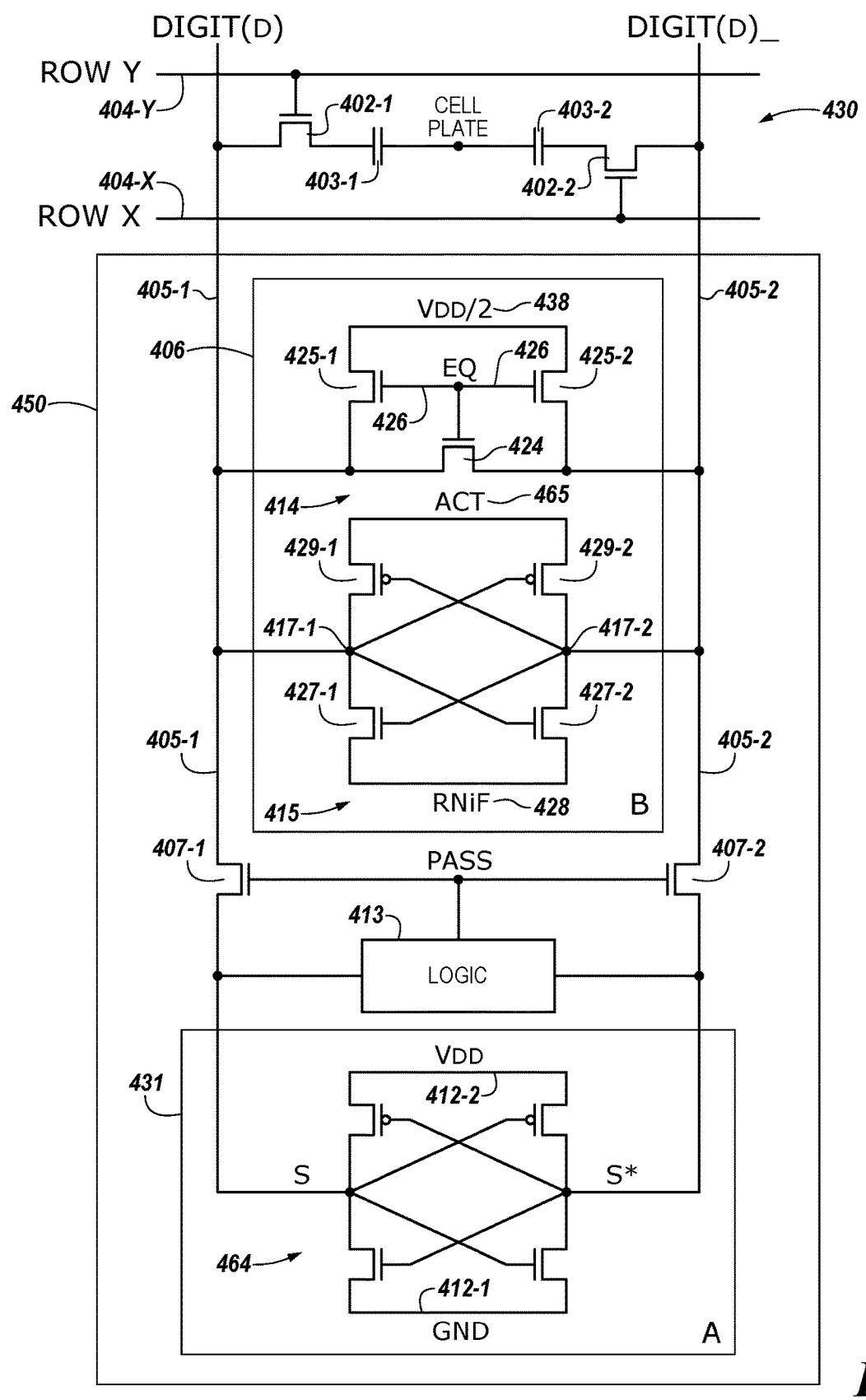
FIG. 4 is a schematic diagram illustrating sensing circuitry to a memory device in accordance with a number of embodiments of the present disclosure.

FIG. 4 is a schematic diagram illustrating sensing circuitry 450 in accordance with a number of embodiments of the present disclosure. The sensing circuitry 450 can correspond to sensing circuitry 150 shown in FIG. 1.

A memory cell can include a storage element, e.g., capacitor, and an access device, e.g., transistor. For instance, a first memory cell can include transistor 402-1 and capacitor 403-1, and a second memory cell can include transistor 402-2 and capacitor 403-2, etc. In this embodiment, the memory array 430 is a DRAM array of 1T1C (one transistor one capacitor) memory cells, although other embodiments of configurations can be use, e.g., 2T2C with two transistors and two capacitors per memory cell. In a number of embodiments, the memory cells may be destructive read memory cells, e.g., reading the data stored in the cell destroys the data such that the data originally stored in the cell is refreshed after being read. The data stored in the memory cells of the memory array 430 also can be refreshed in a self-refresh state as instructed by circuitry, as described herein, located in, or associated with, the memory array 430 and/or a controller 140 coupled thereto, e.g., as opposed to being instructed to refresh by a functionality in the host 110.

Figure 5:
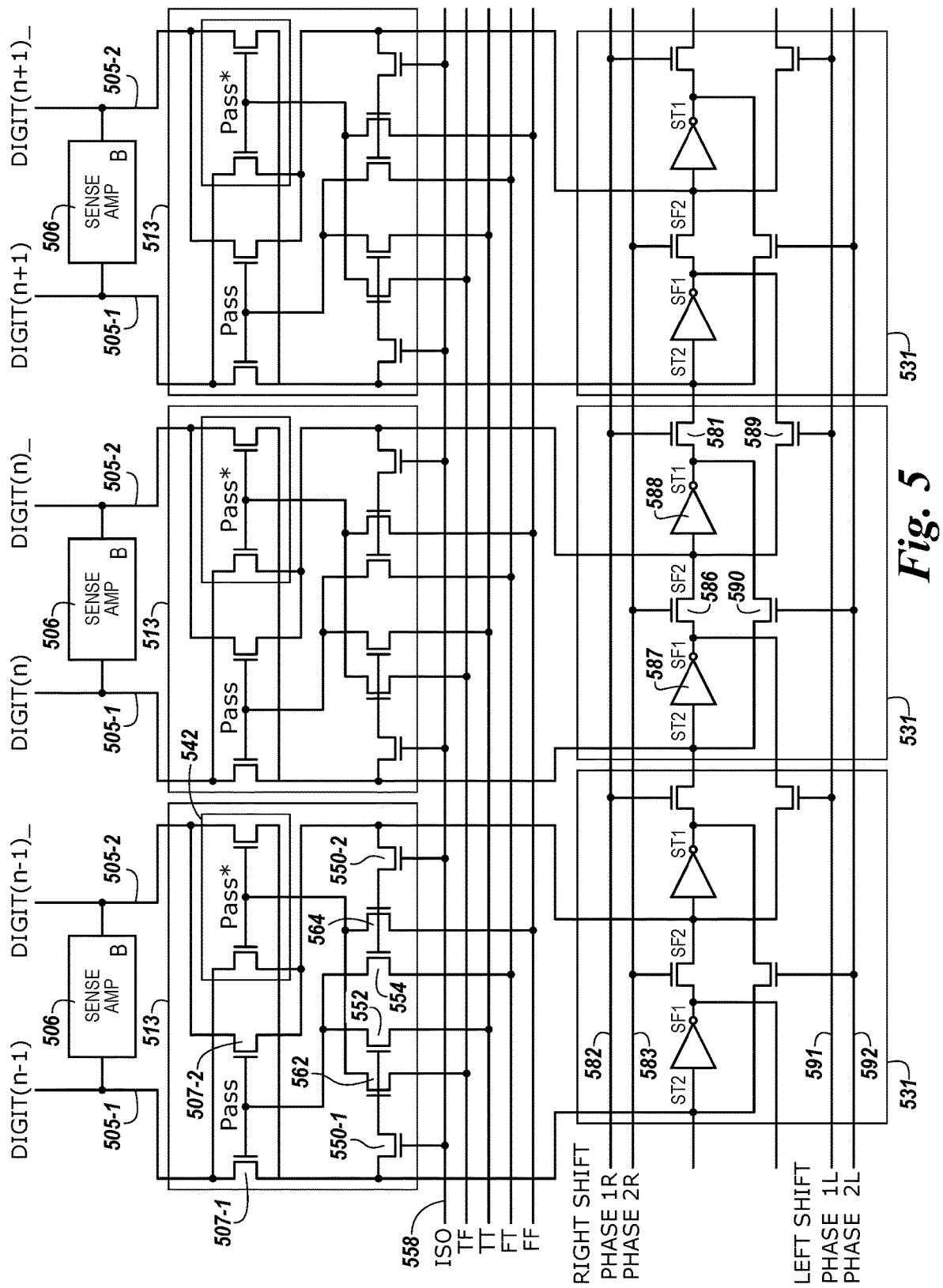
FIG. 5 is another schematic diagram illustrating sensing circuitry to a memory device in accordance with a number of embodiments of the present disclosure.

The cells of the memory array 430 can be arranged in rows coupled by access (word) lines 404-X (Row X), 404-Y (Row Y), etc., and columns coupled by pairs of complementary sense lines, e.g., digit lines DIGIT(D) and DIGIT (D)_ shown in FIG. 4 and DIGIT(n) and DIGIT(n) shown in FIG. 5. The individual sense lines corresponding to each pair of complementary sense lines can also be referred to as digit lines 405-1 for DIGIT (D) and 405-2 for DIGIT (D)_, respectively, or corresponding reference numbers in FIG. 5. Although only one pair of complementary digit lines are shown in FIG. 4, embodiments of the present disclosure are not so limited, and an array of memory cells can include additional columns of memory cells and digit lines, e.g., 4,096, 8,192, 16,384, etc.

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 402-1 can be coupled to digit line 405-1 (D), a second source/drain region of transistor 402-1 can be coupled to capacitor 403-1, and a gate of a transistor 402-1 can be coupled to word line 404-Y. A first source/drain region of a transistor 402-2 can be coupled to digit line 405-2 (D)_, a second source/drain region of transistor 402-2 can be coupled to capacitor 403-2, and a gate of a transistor 402-2 can be coupled to word line 404-X. A cell plate, as shown in FIG. 4, can be coupled to each of capacitors 403-1 and 403-2. The cell plate can be a common node to which a reference voltage, e.g., ground, can be applied in various memory array configurations.

The memory array 430 is configured to couple to sensing circuitry 450 in accordance with a number of embodiments of the present disclosure. In this embodiment, the sensing circuitry 450 comprises a sense amplifier 406 and a compute component 431 corresponding to respective columns of memory cells, e.g., coupled to respective pairs of complementary digit lines. The sense amplifier 406 can be coupled to the pair of complementary digit lines 405-1 and 405-2. The compute component 431 can be coupled to the sense amplifier 406 via pass gates 407-1 and 407-2. The gates of the pass gates 407-1 and 407-2 can be coupled to operation selection logic 413.

The operation selection logic 413 can be configured to include pass gate logic for controlling pass gates that couple the pair of complementary digit lines un-transposed between the sense amplifier 406 and the compute component 431 and swap gate logic for controlling swap gates that couple the pair of complementary digit lines transposed between the sense amplifier 406 and the compute component 431. The operation selection logic 413 can also be coupled to the pair of complementary digit lines 405-1 and 405-2. The operation selection logic 413 can be configured to control continuity of pass gates 407-1 and 407-2 based on a selected operation.

The sense amplifier 406 can be operated to determine a data value, e.g., logic state, stored in a selected memory cell. The sense amplifier 406 can comprise a cross coupled latch, which can be referred to herein as a primary latch. In the example illustrated in FIG. 4, the circuitry corresponding to sense amplifier 406 comprises a latch 415 including four transistors coupled to a pair of complementary digit lines D 405-1 and (D)_ 405-2. However, embodiments are not limited to this example. The latch 415 can be a cross coupled latch, e.g., gates of a pair of transistors, such as n-channel transistors, e.g., NMOS transistors, 427-1 and 427-2 are cross coupled with the gates of another pair of transistors, such as p-channel transistors, e.g., PMOS transistors, 429-1 and 429-2.

In operation, when a memory cell is being sensed, e.g., read, the voltage on one of the digit lines 405-1 (D) or 405-2 (D)_ will be slightly greater than the voltage on the other one of digit lines 405-1 (D) or 405-2 (D)_. An ACT 465 signal and an RNiF 428 signal can be driven low to enable, e.g., fire, the sense amplifier 406. The digit lines 405-1 (D) or 405-2 (D)_ having the lower voltage will turn on one of the PMOS transistor 429-1 or 429-2 to a greater extent than the other of PMOS transistor 429-1 or 429-2, thereby driving high the digit line 405-1 (D) or 405-2 (D)_ having the higher voltage to a greater extent than the other digit line 405-1 (D) or 405-2 (D)_ is driven high.

Similarly, the digit line 405-1 (D) or 405-2 (D)_ having the higher voltage will turn on one of the NMOS transistor 427-1 or 427-2 to a greater extent than the other of the NMOS transistor 427-1 or 427-2, thereby driving low the digit line 405-1 (D) or 405-2 (D)_ having the lower voltage to a greater extent than the other digit line 405-1 (D) or 405-2 (D)_ is driven low. As a result, after a short delay, the digit line 405-1 (D) or 405-2 (D)_ having the slightly greater voltage is driven to the voltage of the supply voltage Vcc through a source transistor, and the other digit line 405-1 (D) or 405-2 (D)_ is driven to the voltage of the reference voltage, e.g., ground, through a sink transistor. Therefore, the cross coupled NMOS transistors 427-1 and 427-2 and PMOS transistors 429-1 and 429-2 serve as a sense amplifier pair, which amplify the differential voltage on the digit lines 405-1 (D) and 405-2 (D)_ and operate to latch a data value sensed from the selected memory cell.

Embodiments are not limited to the sense amplifier 406 configuration illustrated in FIG. 4. As an example, the sense amplifier 406 can be a current-mode sense amplifier and a single-ended sense amplifier, e.g., sense amplifier coupled to one digit line. Also, embodiments of the present disclosure are not limited to a folded digit line architecture such as that shown in FIG. 4.

The sense amplifier 406 can, in conjunction with the compute component 431, be operated to perform various operations using data from an array as input. In a number of embodiments, the result of an operation can be stored back to the array without transferring the data via a digit line address access and/or moved between banks without using an external data bus, e.g., without firing a column decode signal such that data is transferred to circuitry external from the array and sensing circuitry via local I/O lines. As such, a number of embodiments of the present disclosure can enable performing operations and compute functions associated therewith using less power than various previous approaches. Additionally, since a number of embodiments eliminate the need to transfer data across local and global I/O lines and/or external data buses in order to perform compute functions, e.g., between memory and discrete processor, a number of embodiments can enable an increased, e.g., faster, processing capability as compared to previous approaches.

The sense amplifier 406 can further include equilibration circuitry 414, which can be configured to equilibrate the digit lines 405-1 (D) and 405-2 (D)_. In this example, the equilibration circuitry 414 comprises a transistor 424 coupled between digit lines 405-1 (D) and 405-2 (D)_. The equilibration circuitry 414 also comprises transistors 425-1 and 425-2 each having a first source/drain region coupled to an equilibration voltage, e.g., $V_{DD}$ 438, where $V_{DD}$ is a supply voltage associated with the array. A second source/drain region of transistor 425-1 can be coupled digit line 405-1 (D), and a second source/drain region of transistor 425-2 can be coupled digit line 405-2 (D)_. Gates of transistors 424, 425-1, and 425-2 can be coupled together, and to an equilibration (EQ) control signal line 426. As such, activating EQ 426 enables the transistors 424, 425-1, and 425-2, which effectively shorts digit lines 405-1 (D) and 405-2 (D)_ together and to the equilibration voltage, e.g., $V_{DD}/2$ 438.

Although FIG. 4 shows sense amplifier 406 comprising the equilibration circuitry 414, embodiments are not so limited, and the equilibration circuitry 414 may be implemented discretely from the sense amplifier 406, implemented in a different configuration than that shown in FIG. 4, or not implemented at all.

As described further below, in a number of embodiments, the sensing circuitry 450, e.g., sense amplifier 406 and compute component 431, can be operated to perform a selected operation and initially store the result in one of the sense amplifier 406 or the compute component 431. For example, the result may be initially stored in one of the sense amplifier 406 or the compute component 431 without transferring data from the sensing circuitry via a local or global I/O line and/or moved between banks without using an external data bus, e.g., without performing a sense line address access via activation of a column decode signal, for instance.

Performance of operations, e.g., Boolean logical operations involving data values, is fundamental and commonly used. Boolean logical operations are used in many higher level operations. Consequently, speed and/or power efficiencies that can be realized with improved operations can translate into speed and/or power efficiencies of higher order functionalities.

As shown in FIG. 4, the compute component 431 can also comprise a latch, which can be referred to herein as a secondary latch 464. The secondary latch 464 can be configured and operated in a manner similar to that described above with respect to the primary latch 415, with the exception that the pair of cross coupled p-channel transistors, e.g., PMOS transistors, included in the secondary latch can have their respective sources coupled to a supply voltage, e.g., $V_{DD}$ 412-2, and the pair of cross coupled n-channel transistors, e.g., NMOS transistors, of the secondary latch can have their respective sources selectively coupled to a reference voltage, e.g., ground 412-1, such that the secondary latch is continuously enabled. The configuration of the compute component 431 is not limited to that shown in FIG. 4, and various other embodiments are feasible.

The memory device can include a sensing component stripe, e.g., as shown at 124-0, 124-1, . . . , 124-N-1 and described in connection with FIGS. 1B and 1C, configured to include a number of a plurality of sense amplifiers, e.g., 506 as shown in FIG. 5, and compute components, e.g., 531 as shown in FIG. 5, that can correspond to a number of the plurality of columns, e.g., 405-1 and 405-2 in FIGS. 4 and 505-1 and 505-2 in FIG. 5, of the memory cells, where the number of sense amplifiers and/or compute components.

FIG. 5 is a schematic diagram illustrating sensing circuitry capable of implementing an XOR logical operation in accordance with a number of embodiments of the present disclosure. FIG. 5 shows a sense amplifier 506 coupled to a pair of complementary sense lines 505-1 and 505-2, and a compute component 531 coupled to the sense amplifier 506 via pass gates 507-1 and 507-2. The sense amplifier 506 shown in FIG. 5 can correspond to sense amplifier 406 shown in FIG. 4. The compute component 531 shown in FIG. 5 can correspond to sensing circuitry 150, including compute component, shown in FIG. 1A, for example. The logical operation selection logic 513 shown in FIG. 5 can correspond to logical operation selection logic 413 shown in FIG. 4.

The gates of the pass gates 507-1 and 507-2 can be controlled by a logical operation selection logic signal, Pass. For example, an output of the logical operation selection logic can be coupled to the gates of the pass gates 507-1 and 507-2. The compute component 531 can comprise a loadable shift register configured to shift data values left and right.

According to the embodiment illustrated in FIG. 5, the compute components 531 can comprise respective stages, e.g., shift cells, of a loadable shift register configured to shift data values left and right. For example, as illustrated in FIG. 5, each compute component 531, e.g., stage, of the shift register comprises a pair of right-shift transistors 581 and 586, a pair of left-shift transistors 589 and 590, and a pair of inverters 587 and 588. The signals PHASE 1R, PHASE 2R, PHASE 1L, and PHASE 2L can be applied to respective control lines 582, 583, 591 and 592 to enable/disable feedback on the latches of the corresponding compute components 531 in association with performing logical operations and/or shifting data in accordance with embodiments described herein.

The sensing circuitry shown in FIG. 5 also shows a logical operation selection logic 513 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 505-1 and 505-2 when the isolation transistors 550-1 and 550-2 are enabled via the ISO control signal 558 being asserted.

According to various embodiments, the logical operation selection logic 513 can include four logic selection transistors: logic selection transistor 562 coupled between the gates of the swap transistors 542 and a TF signal control line, logic selection transistor 552 coupled between the gates of the pass gates 507-1 and 507-2 and a TT signal control line, logic selection transistor 554 coupled between the gates of the pass gates 507-1 and 507-2 and a FT signal control line, and logic selection transistor 564 coupled between the gates of the swap transistors 542 and a FF signal control line. Gates of logic selection transistors 562 and 552 are coupled to the true sense line through isolation transistor 550-1, e.g., having a gate coupled to an ISO signal control line. Gates of logic selection transistors 564 and 554 are coupled to the complementary sense line through isolation transistor 550-2, e.g., also having a gate coupled to an ISO signal control line.

Data values present on the pair of complementary sense lines 505-1 and 505-2 can be loaded into the compute component 531 via the pass gates 507-1 and 507-2. The compute component 531 can comprise a loadable shift register. When the pass gates 507-1 and 507-2 are OPEN, data values on the pair of complementary sense lines 505-1 and 505-2 are passed to the compute component 531 and thereby loaded into the loadable shift register. The data values on the pair of complementary sense lines 505-1 and 505-2 can be the data value stored in the sense amplifier 506 when the sense amplifier is fired. The logical operation selection logic signal, Pass, is high to OPEN the pass gates 507-1 and 507-2.

The ISO, TF, TT, FT, and FF control signals can operate to select a logical function to implement based on the data value ("B") in the sense amplifier 506 and the data value ("A") in the compute component 531. In particular, the ISO, TF, TT, FT, and FF control signals are configured to select the logical function to implement independent from the data value present on the pair of complementary sense lines 505-1 and 505-2, although the result of the implemented logical operation can be dependent on the data value present on the pair of complementary sense lines 505-1 and 505-2. For example, the ISO, TF, TT, FT, and FF control signals may select the logical operation to implement directly because the data value present on the pair of complementary sense lines 505-1 and 505-2 is not passed through logic to operate the gates of the pass gates 507-1 and 507-2.

Additionally, FIG. 5 shows swap transistors 542 configured to swap the orientation of the pair of complementary sense lines 505-1 and 505-2 between the sense amplifier 506 and the compute component 531. When the swap transistors 542 are OPEN, data values on the pair of complementary sense lines 505-1 and 505-2 on the sense amplifier 506 side of the swap transistors 542 are oppositely-coupled to the pair of complementary sense lines 505-1 and 505-2 on the compute component 531 side of the swap transistors 542, and thereby loaded into the loadable shift register of the compute component 531.

The logical operation selection logic signal Pass can be activated, e.g., high, to OPEN the pass gates 507-1 and 507-2, e.g., conducting, when the ISO control signal line is activated and either the TT control signal is activated, e.g., high, and data value on the true sense line is "1" or the FT control signal is activated, e.g., high, and the data value on the complement sense line is "1."

The data value on the true sense line being a "1" OPENs logic selection transistors 552 and 562. The data value on the complimentary sense line being a "1" OPENs logic selection transistors 554 and 564. If the ISO control signal or either the respective TT/FT control signal or the data value on the corresponding sense line, e.g., sense line to which the gate of the particular logic selection transistor is coupled, is not high, then the pass gates 507-1 and 507-2 will not be OPENed by a particular logic selection transistor.

The logical operation selection logic signal Pass* can be activated, e.g., high, to OPEN the swap transistors 542, e.g., conducting, when the ISO control signal line is activated and either the TF control signal is activated, e.g., high, and data value on the true sense line is "1," or the FF control signal is activated, e.g., high, and the data value on the complement sense line is "1." If either the respective control signal or the data value on the corresponding sense line, e.g., sense line to which the gate of the particular logic selection transistor is coupled, is not high, then the swap transistors 542 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 5 is configured to select one of a plurality of logical operations to implement directly from the four logic selection control signals, e.g., logical operation selection is not dependent on the data value present on the pair of complementary sense lines. Some combinations of the logic selection control signals can cause both the pass gates 507-1 and 507-2 and swap transistors 542 to be OPEN at the same time, which shorts the pair of complementary sense lines 505-1 and 505-2 together. According to a number of embodiments of the present disclosure, the logical operations which can be implemented by the sensing circuitry illustrated in FIG. 5 can be the logical operations summarized in the logic tables shown in FIG. 6.

Figure 6:
FIG. 6 is a logic table illustrating selectable logical operation results implemented by a sensing circuitry in accordance with a number of embodiments of the present disclosure.

FIG. 6 is a logic table illustrating selectable logical operation results implemented by a sensing circuitry shown in FIG. 5 in accordance with a number of embodiments of the present disclosure. The four logic selection control signals, e.g., TF, TT, FT, and FF, in conjunction with a particular data value present on the complementary sense lines, can be used to select one of plural logical operations to implement involving the starting data values stored in the sense amplifier 506 and compute component 531. The four control signals, in conjunction with a particular data value present on the complementary sense lines, controls the continuity of the pass gates 507-1 and 507-2 and swap transistors 542, which in turn affects the data value in the compute component 531 and/or sense amplifier 506 before/ after firing. The capability to selectably control continuity of the swap transistors 542 facilitates implementing logical operations involving inverse data values, e.g., inverse operands and/or inverse result, among others.

Logic Table 6-1 illustrated in FIG. 6 shows the starting data value stored in the compute component 531 shown in column A at 644, and the starting data value stored in the sense amplifier 506 shown in column B at 645. The other 3 column headings in Logic Table 6-1 refer to the continuity of the pass gates 507-1 and 507-2, and the swap transistors 542, which can respectively be controlled to be OPEN or CLOSED depending on the state of the four logic selection control signals, e.g., TF, TT, FT, and FF, in conjunction with a particular data value present on the pair of complementary sense lines 505-1 and 505-2. The "Not Open" column 656 corresponds to the pass gates 507-1 and 507-2 and the swap transistors 542 both being in a non-conducting condition, the "Open True" column 670 corresponds to the pass gates 507-1 and 507-2 being in a conducting condition, and the "Open Invert" column 673 corresponds to the swap transistors 542 being in a conducting condition. The configuration corresponding to the pass gates 507-1 and 507-2 and the swap transistors 542 both being in a conducting condition is not reflected in Logic Table 6-1 since this results in the sense lines being shorted together.

Via selective control of the continuity of the pass gates 507-1 and 507-2 and the swap transistors 542, each of the three columns of the upper portion of Logic Table 6-1 can be combined with each of the three columns of the lower portion of Logic Table 6-1 to provide 3×3=9 different result combinations, corresponding to nine different logical operations, as indicated by the various connecting paths shown at 675. The nine different selectable logical operations that can be implemented by the sensing circuitry, e.g., 150 in FIG. 1A, are summarized in Logic Table 6-2 illustrated in FIG. 6, including an XOR logical operation.

The columns of Logic Table 6-2 illustrated in FIG. 6 show a heading 680 that includes the state of logic selection control signals. For example, the state of a first logic selection control signal is provided in row 676, the state of a second logic selection control signal is provided in row 677, the state of a third logic selection control signal is provided in row 678, and the state of a fourth logic selection control signal is provided in row 679. The particular logical operation corresponding to the results is summarized in row 647, including the XOR logical operation shown at AXB, which is intended to mean A XOR B.

Figure 7:
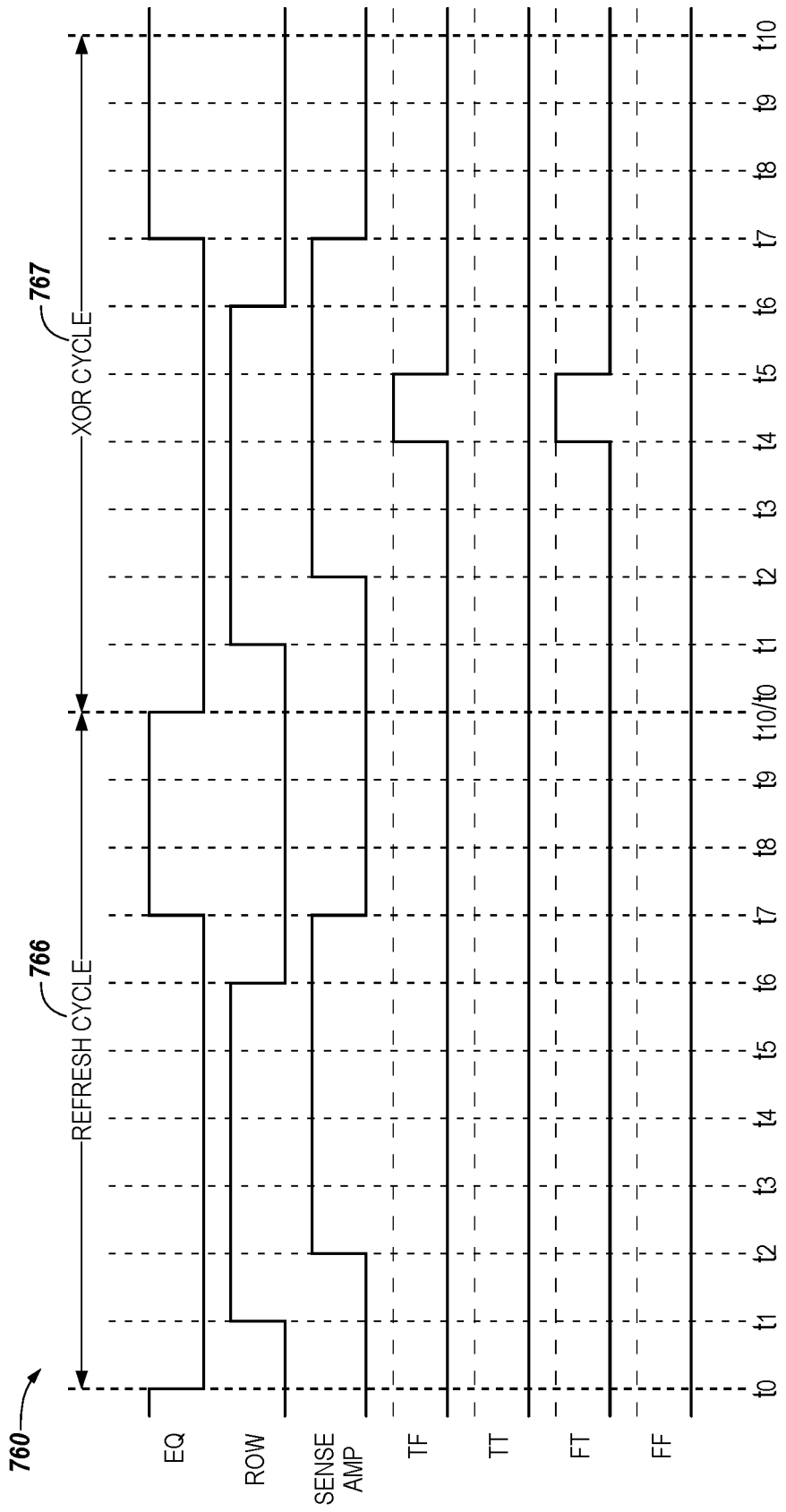
FIG. 7 illustrates a timing diagram associated with performing a refresh operation by a memory device in a self-refresh state, in comparison to performing a logical operation, using the sensing circuitry in accordance with a number of embodiments of the present disclosure.

FIG. 7 illustrates a timing diagram 760 associated with performing a refresh operation by a memory device in a self-refresh state, in comparison to performing a logical operation, using the sensing circuitry in accordance with a number of embodiments of the present disclosure. The timing diagram 760 schematically illustrated in FIG. 7 is shown as an example of a sequence of signals to enable a refresh operation in a self-refresh state, e.g., a refresh cycle 766, on the left side of the timing diagram 760. The timing diagram 760 schematically compares the sequence of signals to enable the refresh cycle 766 with a sequence of signals to enable performance of a logical operation, such as an XOR operation, e.g., an XOR cycle 767, shown on the right side of the timing diagram 760. In some embodiments, the sequences of signals for both the refresh cycle 766, which is performed in the self-refresh state, and the XOR cycle 767, which may be performed in the self-refresh state or during active interaction with the host 110, may be sent by the controller 140, e.g., timing circuitry 133 thereof, as described in connection with FIG. 1E. A time scale for the refresh cycle 766 and the XOR cycle 767 is horizontally demarcated in signaling units $(t_0, t_1, t_2, \ldots, t_{10})$ of arbitrary length and is shown by way of example.

As described herein, sensing circuitry 150, e.g., as described in connection with FIGS. 1A and 1C and elsewhere herein, can be configured to implement the refresh cycle 766 and a compute operation, e.g., read, write, erase, etc., or one of a plurality of selectable logical operations at a time, e.g., including XOR cycle 767.

A result of a selected logical operation is based on a first data value that may be stored in a sense amplifier and a second data value that may be stored in a compute component, e.g., an accumulator, a shift circuit. The result of the selected logical operation may be initially stored in the sense amplifier for some selected logical operations, and may be initially stored in the compute component for some selected logical operations. Some selected logical operations may be implemented so as to have the result stored in either the sense amplifier or the compute component. In a number of embodiments, whether a result of a logical operation is initially stored in the sense amplifier or the compute component can depend on when logical selection control signals corresponding to a selected logical operation to be performed are provided to logical selection logic of the sensing circuitry, e.g., whether the logic selection control signals are fired before or after the sense amplifier is fired. According to some embodiments, logical operation selection logic may be configured to control pass gates, e.g., control continuity of the pass gates, based on a data value stored in the compute component and the selected logical operation. Controlling continuity of a gate, e.g., transistor, may be used herein to refer to controlling whether or not the gate is conducting, e.g., whether a channel of the transistor is in a conducting or non-conducting state.

The timing diagram 760 shown in FIG. 7 is associated with performing a refresh cycle 766 and an XOR cycle 767 on a ROW X data value, e.g., as shown in connection with row 404-X, transistor 402-2, and capacitor 403-2 in FIG. 4, and a ROW Y data value, e.g., as shown in connection with row 404-Y, transistor 402-1, and capacitor 403-1 in FIG. 4. Reference is made to the sensing circuitry 150 that includes the sense amplifiers 406 and 506 and the compute components 431 and 531 described in connection with FIGS. 4 and 5, respectively.

At time $t_0$ for both the refresh cycle 766 and the XOR cycle 767, EQ is disabled and the ROW X data value may be latched in the compute component, e.g., 431. At time $t_1$, ROW Y is enabled, e.g., goes high, to access, e.g., select, the ROW Y memory cell. At time $t_2$, the sense amplifier, e.g., 406, is enabled, e.g., goes high, is fired, which drives the complementary sense lines, e.g., 405-1 and 405-2 and 505-1 and 505-2 in FIGS. 4 and 5, respectively, to the appropriate rail voltages, e.g., $V_{DD}$ 412-2 and GND 412-1, responsive to the ROW Y data value, e.g., as shown by the DIGIT and DIGIT_ signals, and the ROW Y data value is latched in the sense amplifier, e.g., 406.

For the XOR cycle 767 only, at time $t_4$, the PHASE 2R and PHASE 2L, e.g., as shown at 583 and 592, respectively, and described in connection with FIG. 5, signals can go low, which may disable feedback on the latch of the compute component 531, e.g., by turning off transistors 586 and 590, respectively, such that the value stored in the compute component 531 may be overwritten during the logical operation. Also, at time $t_4$, the ISO control signal 558 goes low, which disables isolation transistors 550-1 and 550-2. Since the desired logical operation in this example is an XOR operation, at time $t_4$, FT 677 and TF 678 are enabled while FF 676 and TT 679 remain disabled, as shown in Table 6-2 where FF=0, FT=1, TF=1, and TT=0 corresponds to a logical XOR, e.g., "AXB", operation. Whether enabling TF and FT results in PASS or PASS* going high depends on the value stored in the compute component 531 when ISO 558 is disabled at time $t_4$. For example, enable transistor 562 will conduct if node ST2 was high when ISO is disabled, and enable transistor 562 will not conduct if node ST2 was low when ISO was disabled at time $t_4$. Similarly, enable transistor 554 will conduct if node SF2 was high when ISO 558 is disabled, and enable transistor 554 will not conduct if node SF2 was low when ISO is disabled.

In this example, if PASS goes high at time $t_4$, the pass transistors 507-1 and 507-2 are enabled such that the DIGIT and DIGIT_ signals, which correspond to the ROW Y data value, are provided to the respective compute component nodes ST2 and SF2. As such, the value stored in the compute component 531 (e.g., the ROW X data value) may be flipped, depending on the value of DIGIT and DIGIT (e.g., the ROW Y data value). In this example, if PASS stays low at time $t_4$, the pass transistors 507-1 and 507-2 are not enabled such that the DIGIT and DIGIT signals, which correspond to the ROW Y data value, remain isolated from the nodes ST2 and SF2 of the compute component 531. As such, the data value in the compute component (e.g., the ROW X data value) would remain the same. In this example, if PASS* goes high at time $t_4$, the swap transistors 542 are enabled such that the DIGIT and DIGIT signals, which correspond to the ROW Y data value, are provided to the respective compute component nodes ST2 and SF2 in a transposed manner, e.g., the "true" data value on DIGIT(n) would be provided to node SF2 and the "complement" data value on DIGIT(n) would be provided to node ST2. As such, the value stored in the compute component 53, e.g., the ROW X data value, may be flipped, depending on the value of DIGIT and DIGIT_, e.g., the ROW Y data value. In this example, if PASS* stays low at time $t_4$, the swap transistors 542 are not enabled such that the DIGIT and DIGIT signals, which correspond to the ROW Y data value, remain isolated from the nodes ST2 and SF2 of the compute component 531. As such, the data value in the compute component, e.g., the ROW X data value, would remain the same.

At time $t_5$, TF and FT are disabled, which results in PASS and PASS* going (or remaining) low, such that the pass transistors 507-1 and 507-2 and swap transistors 542 are disabled. At time $t_5$, ROW Y is disabled, and PHASE 2R, PHASE 2L, and ISO are enabled. Enabling PHASE 2R and PHASE 2L at time $t_5$ enables feedback on the latch of the compute component 531 such that the result of the XOR operation (e.g., "A" XOR "B") is latched therein. Enabling ISO 558 at time $t_5$ again couples nodes ST2 and SF2 to the gates of the enable transistors 552, 554, 562, and 564.

At time $t_7$ for both the refresh cycle 766 and the XOR cycle 767, equilibration is enabled, e.g., EQ goes high such that DIGIT and DIGIT are driven to an equilibrate voltage and the sense amplifier 506 is disabled, e.g., goes low. The sense (read) operation included in both the refresh cycle 766 and the XOR cycle 767 coupling to the row to access data values from the memory cells therein destroys the data such that the data originally stored in the memory cell may be refreshed after being read. In the case of a compute operation, e.g., a read operation, performed during the self-refresh state, the data values may be utilized for performance of the high latency operations described herein and transferred back, e.g., refreshed, to the memory array, e.g., to a memory cell coupled to ROW X, ROW Y, and/or a different row via the complementary sense lines. In the case of a logical operation, e.g., an XOR operation, performed during the self-refresh state, the result of the XOR operation, which is initially stored in the compute component 531 in this example, can be transferred to the memory array e.g., to a memory cell coupled to ROW X, ROW Y, and/or a different row via the complementary sense lines.

Initiation at $t_0$ of the refresh cycle 766 and/or the XOR cycle 767 just described coincides with initiation of performance of the compute operations and/or logical operations in the self-refresh state. As described herein, a refresh cycle interval which may be around 15 µs, e.g., in a default self-refresh mode, which determines the rate at which the data may be read from each row to perform the compute and/or logical operations described herein. When no longer in the self-refresh state, the results of performance of the high latency compute and/or logical operations may be sent to and/or accessed by an external location, e.g., an external processing component of the host 110, via I/O lines.

Embodiments described herein provide a method of operating an apparatus that may be in the form of a computing system 100 including a memory device 120 for performing operations, as described herein, by the memory device in a self-refresh state. As described herein, the method can include selecting from a plurality of modes, e.g., as shown at 235, 237, and 239 and described in connection with FIG. 4, for performance of compute operations and/or logical operations and performing the compute operations and/or logical operations, corresponding to the selected mode, on data stored in memory cells of the memory device when the memory device is in a self-refresh state.

The method can include adjusting a frequency of performance of a memory refresh cycle for the data stored in the memory cells and performing the compute operations at a rate corresponding to the adjusted frequency of performance of the memory refresh cycle, as described in connection with FIGS. 4 and 5. Each compute operation and/or logical operation may be controlled to correspond to a period of a counter register, e.g., 136-1 and 136-2 described in connection with FIGS. 1A, 1B, and 1E, that controls a frequency of performance of a memory refresh cycle for the data stored in the memory cells.

The method can include performing the compute and/or logical operations described herein in the self-refresh state, in which high latency is not a burden for performing such operations. A battery-powered mobile device, for example, may be in a low power state quite often, e.g., while in a user's pocket or purse, while the user is asleep, etc. During those periods, the data stored in memory cells may be retained there because the memory device is in the self-refresh state. The compute operations described herein may be performed with high latency in the self-refresh state because, for example, the user is not actively interacting with the mobile device so lack of low latency and/or presence of high latency in performance of operations is not noticeable. The high latency may not be a burden because the data is processed in memory during the low power and/or self-refresh state and the processed data is available for access by the user at some later time.

Examples of applications that may be operated to take advantage of the low power and/or self-refresh state may include operations intended to run as background operations that may not involve user interaction, e.g., with the host. Such high latency background operations may include: facial detection in images; feature extraction from images; security scan of in-memory threats, such as viruses, worms, Trojan horses, etc.; neural network processing; and parsing of large data sets; among other types of operations. Other operations that may be performed in the low power and/or self-refresh state may include operations that may not use a full computing potential, e.g., accuracy and/or speed, of a computing system, even though a user may be actively interacting with the system. Such operations may include: electronic games; video playback; and camera input; among other types of operations. In some examples, for error-tolerant applications, e.g., graphics applications, data may be self-refreshed and operations performed at a rate lower than the default frequency for a memory refresh cycle in the self-refresh state, e.g., in order to reduce power consumption, with minor quality loss, e.g., as approximate computing. At least some of these operations may include performing logical operations, e.g., PIM operations such as Boolean operations, as described herein. Whereas these operations may be performed in the self-refresh state, performance as such may be intended to provide a result that is accessible when the memory device is not in the self-refresh state and is interacting with the host.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the memory device, controller, counter register, mode register, memory array, sensing circuitry, logic circuitry, and/or cache disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
    a memory device; and
    a host configured to operate in a first power mode in which commands are provided to the memory device and a second power mode in which commands are not provided to the memory device;
    wherein the memory device is configured to:
        enter a self-refresh state responsive to the host entering the second power mode; and
        while in the self-refresh state, operate in a selected one of a plurality of modes, wherein the plurality of modes includes:
            a first mode in which the memory device is configured to perform compute operations on data stored in an array of the memory device; and
            a second mode in which the memory device is configured to not perform compute operations on data stored in the array.

2. The system of claim 1, wherein the second power state is a low power state in which no data or commands are transferred between the host and the memory device.

3. The system of claim 1, wherein the memory device includes a mode register configured to provide the plurality of modes.

4. The system of claim 1, wherein the memory device is configured to, while in the self-refresh state and operating in the first mode, perform compute operations on data stored in the array to perform facial detection in image data, or feature extraction from image data, or both.

5. The system of claim 1, wherein the memory device is configured to, while in the self-refresh state and operating in the first mode, perform compute operations on data stored in the array to perform a security scan of in-memory threats.

6. The system of claim 1, wherein the memory device is configured to, while in the self-refresh state and operating in the first mode, perform compute operations on data stored in the array to perform neural network processing.

7. The system of claim 1, wherein the memory device is configured to, while in the self-refresh state and operating in the first mode, perform compute operations on data stored in the array at a slower rate than a rate at which the memory device is configured to perform compute operations when not in the self-refresh state.

8. The system of claim 7, wherein the slower rate corresponds to a default refresh rate used to refresh the array when the memory device is in the self-refresh state.

9. The system of claim 1, wherein the memory device is a processing in memory device comprising control circuitry configured to direct performance of compute operations on data stored in the array when the memory device is in the self-refresh state and when the memory device is in a state other than the self-refresh state.

10. The system of claim 1, wherein the system is a battery-powered mobile device.

11. The system of claim 1, wherein the memory device comprises:
    sensing circuitry coupled to the array and comprising a plurality of compute components; and
    control circuitry configured to operate the plurality of compute components as respective one bit processing elements in association with performing compute operations on data stored in the array.

12. An apparatus, comprising:
an array of memory cells coupled to sensing circuitry; and
control circuitry coupled to the array and configured to:
    receive commands from a host when the host is operating in a first power mode;
    operate in a self-refresh state responsive to the host entering a second power mode in which commands are not received from the host;
    while operating in the self-refresh state, operate in a selected one of a plurality of modes, wherein the plurality of modes includes:
        a first mode in which the control circuitry is configured to control performance of compute operations on data stored in the array; and
        a second mode in which the control circuitry is configured to not perform compute operations on data stored in the array.

13. The apparatus of claim 12, wherein the apparatus comprises a battery-powered mobile device in which the host is coupled to a memory device, wherein the memory devices comprises:
- the array of memory cells;
- the control circuitry; and
- a mode register configured to be set by the host to indicate the selected one of the plurality of modes.

14. The apparatus of claim 13, wherein the compute operations performed while the control circuitry is operating in the self-refresh state and in accordance with the first mode, are performed to process data to be later accessed by the host subsequent to the host returning from the second power mode to the first power mode.

15. The apparatus of claim 12, wherein the plurality of modes includes a third mode in which the control circuitry is configured to control performance of compute operations on data stored in the array at a different rate than a rate corresponding to the first mode.

16. The apparatus of claim 15, wherein the rate corresponding to the first mode is aligned with a default frequency for a memory refresh cycle corresponding to the self-refresh state.

17. The apparatus of claim 12, wherein the control circuitry is configured to, while operating in the first mode corresponding to the self-refresh state, control processing of image data stored in the array via the compute operations.

18. A system, comprising:
- a processing in memory device; and
- a host configured to operate in a power mode in which commands are provided to the processing in memory device and a low power mode in which commands are not provided to the processing in memory device;
- wherein the processing in memory device is configured to:
  - enter a self-refresh state responsive to the host entering the low power mode, wherein a default frequency for a refresh cycle corresponding to the self-refresh state is different than a frequency for a refresh cycle corresponding to a non-self-refresh state;
  - while in the self-refresh state and commands are not being provided to the processing in memory device from the host, perform a background operation that does not involve interaction with the host; and
  - responsive to the host exiting the self-refresh state, provide a result of the background operation to the host.

19. The system of claim 18, wherein the background operation is an operation selected from the group comprising:
- a facial detection in images operation;
- a feature extraction in images operation;
- security scan of in-memory threats operation; and
- a neural network processing operation.

20. The system of claim 18, wherein the processing in memory device includes a mode register configured to be set, by the host, to indicate the selected one of the plurality of modes, and wherein the plurality of modes includes:
- a second mode in which the processing in memory device is configured to not execute compute operations on data stored in the array; and
- a third mode in which the processing in memory device is configured to execute the compute operations on the data stored in the array at a rate that is different than a rate at which the compute operations are executed when the processing in memory device is in the first mode.

* * * * *